(12) United States Patent
Watanabe

(10) Patent No.: US 10,374,413 B2
(45) Date of Patent: Aug. 6, 2019

(54) SWITCHING POWER SUPPLY AND METHOD OF SHORT-CIRCUIT-TO-GROUND DETECTION THEREFOR

(71) Applicant: Rohm Co., Ltd., Kyoto (JP)

(72) Inventor: Yukihiro Watanabe, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 15/933,826

(22) Filed: Mar. 23, 2018

(65) Prior Publication Data
US 2018/0278045 A1 Sep. 27, 2018

(30) Foreign Application Priority Data

Mar. 27, 2017 (JP) .................................. 2017-060791
Mar. 7, 2018 (JP) .................................. 2018-040865

(51) Int. Cl.
| | | |
|---|---|---|
| *H02M 1/36* | (2007.01) | |
| *H02H 7/12* | (2006.01) | |
| *H02M 3/158* | (2006.01) | |
| *G01R 19/165* | (2006.01) | |
| *H02M 3/157* | (2006.01) | |
| *H02H 1/00* | (2006.01) | |
| *H02M 1/08* | (2006.01) | |
| *H02M 1/32* | (2007.01) | |

(52) U.S. Cl.
CPC ..... *H02H 7/1213* (2013.01); *G01R 19/16538* (2013.01); *H02H 1/0007* (2013.01); *H02M 1/08* (2013.01); *H02M 1/36* (2013.01); *H02M 3/157* (2013.01); *H02M 3/1588* (2013.01); *H02M 1/32* (2013.01); *Y02B 70/1466* (2013.01)

(58) Field of Classification Search
CPC ........ H02M 1/36; H02M 1/32; H02H 7/1213; H02H 9/02; H02H 3/08
See application file for complete search history.

(56) References Cited

U.S. PATENT DOCUMENTS

| | | | | |
|---|---|---|---|---|
| 7,019,507 B1 * | 3/2006 | Dittmer | .................... | H02M 1/32 323/271 |
| 7,116,565 B1 * | 10/2006 | Yang | .................... | H02H 7/1227 363/24 |
| 7,723,972 B1 * | 5/2010 | Balogh | .................... | H02M 1/36 323/282 |
| 2009/0273738 A1 | 11/2009 | Fukumoto | | |

(Continued)

FOREIGN PATENT DOCUMENTS

| | | |
|---|---|---|
| JP | 4627320 | 11/2010 |
| JP | 2011-167013 | 8/2011 |

*Primary Examiner* — Harry R Behm
(74) *Attorney, Agent, or Firm* — Fish & Richardson P.C.

(57) ABSTRACT

A switching power supply detects a short circuit to ground, for example, by comparing a soft-start voltage Vss with a feedback voltage Vfb while securing an offset voltage ΔV. The switching power supply includes, for example, a short-circuit-to-ground detection circuit which detects a short circuit to ground at a monitoring target terminal. When a short circuit to ground occurs for the first time, the output of the short-circuit-to-ground detection circuit is masked for a first period. When a short circuit to ground occurs for the second or any succeeding time, the output of the short-circuit-to-ground detection circuit is masked for a second period shorter than the first period.

19 Claims, 13 Drawing Sheets

(56) References Cited

U.S. PATENT DOCUMENTS

| | | | |
|---|---|---|---|
| 2010/0066328 A1* | 3/2010 | Shimizu | H02M 3/1588 323/282 |
| 2012/0062198 A1* | 3/2012 | Takano | G05F 1/565 323/282 |
| 2014/0217999 A1* | 8/2014 | Wibben | H02M 1/36 323/282 |
| 2015/0042299 A1* | 2/2015 | Li | H02M 1/36 323/271 |
| 2016/0329807 A1* | 11/2016 | Daly | H02M 3/156 |

* cited by examiner

SWITCHING POWER SUPPLY AND METHOD OF SHORT-CIRCUIT-TO-GROUND DETECTION THEREFOR

CROSS-REFERENCE TO RELATED APPLICATIONS

This nonprovisional application claims priority under 35 U.S.C. § 119(a) on Patent Applications No. 2017-60791 filed in Japan on Mar. 27, 2017 and No. 2018-40865 filed in Japan on Mar. 7, 2018, the entire contents of which are hereby incorporated by reference.

BACKGROUND OF THE INVENTION

Field of the Invention

The present invention relates to a switching power supply and a method of short-circuit-to-ground detection therefor. In particular, the present invention relates to a switching power supply that prevents an increase in current flowing in an output transistor when an output terminal or a feedback terminal of the switching power supply is short-circuited to a ground potential, and a method of short-circuit-to-ground detection therefor.

Description of Related Art

A switching power supply is an electric power conversion device that steps down or up an input voltage into an output voltage different from the input voltage, in which a semiconductor device (so-called power control IC) as a control main body controls an output transistor to operate so that a step-down operation or a step-up operation is performed. In this case, the switching power supply drives the output transistor that drives a load, using a pulse width modulation (PWM) signal, for example. Therefore, the switching power supply generally has higher power conversion efficiency than a linear power supply, and hence can reduce power consumption of a system. However, when a malfunction such as a short circuit to the ground occurs at the output terminal or the like of the switching power supply, current flowing in the output transistor of the switching power supply increases, and hence the output transistor may be deteriorated.

For example, JP-A-2011-167013 (hereinafter referred to as Patent Document 1) discloses a load current limiting method in a switching power supply. Note that the switching power supply described in Patent Document 1 is equipped with a short circuit protection signal generation circuit. When the output voltage becomes lower than a reference voltage, it is determined that a load short circuit has occurred. Then, a switching element is turned off by a short circuit protection signal output from the short circuit protection signal generation circuit so as to stop the load current, and hence the semiconductor device is protected.

In addition, for example, Japanese Patent 4627320 (hereinafter referred to as Patent Document 2) discloses a load current limiting method in an inverter. Note that the inverter described in Patent Document 2 is equipped with a first protection circuit and a second protection circuit. The first protection circuit detects a circuit abnormality in the inverter and stops switching control of the inverter when a circuit abnormality such as overcurrent, an overvoltage, a short circuit to ground, or a short circuit to power supply continues for a predetermined abnormality detection period. The second protection circuit monitors a feedback voltage corresponding to an output voltage of the inverter. When the feedback voltage is lower than a predetermined threshold voltage, the second protection circuit decreases the reference voltage and sets the abnormality detection period to be shorter.

However, in the load current limiting method in the switching power supply of Patent Document 1, a delay time is generated after the circuit abnormality is detected until the load current is stopped. In reality, the load current stops after a delay time elapses after the switching element is turned off. In this method, when a circuit abnormality occurs, the switching element continues to operate until a predetermined period elapses, i.e. during a mask period, and hence there is a malfunction that the load is put on the device.

The inverter of Patent Document 2 has room for improvement in detection of a predetermined abnormality detection period, necessity of the first protection circuit and the second protection circuit, and further a little complicated circuit structure for controlling to decrease the reference voltage, and the like.

SUMMARY OF THE INVENTION

In order to solve the problems existing in Patent Documents described above, it is an object of the present invention to provide a switching power supply capable of quickly and appropriately detecting a short circuit to ground of a switching terminal or a feedback terminal with a relatively simple circuit structure.

A switching power supply according to one aspect of the present invention includes a switching unit arranged to turn on and off an output transistor and a synchronous rectification semiconductor element to drive an inductor so that an output voltage is generated from an input voltage, an error amplifier arranged to generate an error voltage corresponding to a difference between a predetermined first reference voltage and the output voltage or a feedback voltage corresponding to the output voltage, a soft-start circuit arranged to generate a soft-start voltage, a pulse width modulation (PWM) comparator arranged to compare the error voltage with the soft-start voltage so as to generate a pulse width modulation signal, a driving circuit arranged to receive an input of the pulse width modulation signal so as to generate a drive signal for the switching unit, and an offset comparator arranged to compare the soft-start voltage with the feedback voltage, with a predetermined offset voltage. When Vss≥Vfb+ΔV holds, where Vss represents the soft-start voltage, Vfb represents the feedback voltage, and ΔV represents the offset voltage, then the output transistor is turned off via the driving circuit based on an offset detection signal output from the offset comparator.

In addition, a method for detecting a short circuit to ground in a switching power supply according to one aspect of the present invention includes masking short-circuit-to-ground detection during a short-circuit-to-ground detection time period tx1 until the short-circuit-to-ground detection signal is generated when a short circuit to ground occurs for the first time after an enable signal is input, and masking short-circuit-to-ground detection during a short-circuit-to-ground detection time period tx2 until the offset detection signal is generated when a short circuit to ground occurs for the second time after the first short circuit to ground is cancelled in a state where input of the enable signal is continued.

Further, a switching power supply according to another aspect of the present invention includes a short-circuit-to-ground detection circuit arranged to perform short-circuitto-ground detection of a monitoring target terminal, in which an output of the short-circuit-to-ground detection circuit is masked during a first period when a short circuit to ground occurs for the first time, and the output of the short-circuit-to-ground detection circuit is masked during a second period shorter than the first period when a short circuit to ground occurs for the second or any succeeding time.

Note that other features, elements, steps, advantages, and characteristics of the present invention will become more apparent from the description of the best mode embodiment given below and the related attached drawings.

DETAILED DESCRIPTION OF THE PREFERRED EMBODIMENTS

First Embodiment

Figure 1:
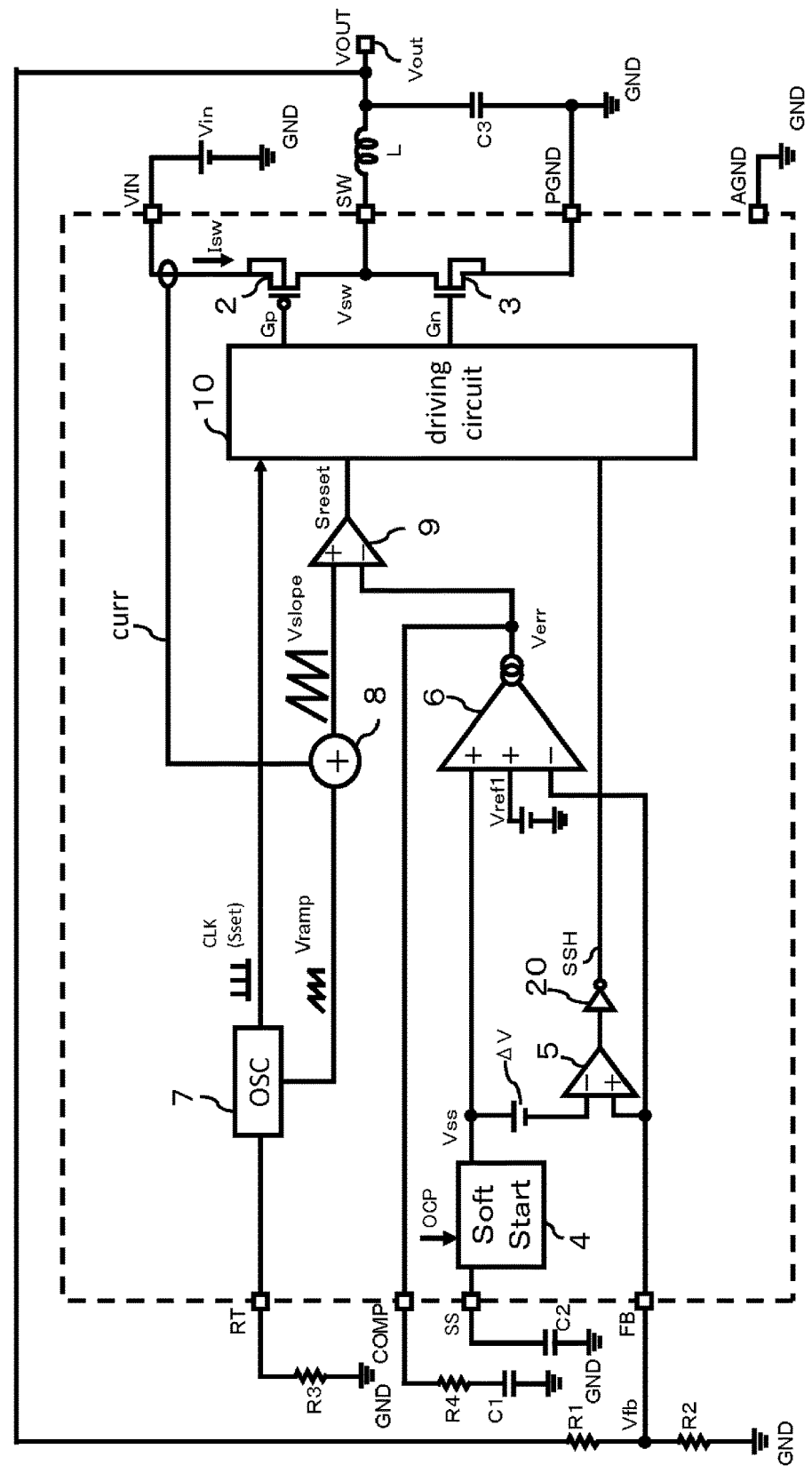
FIG. 1 is a circuit structure diagram illustrating a first embodiment when the present invention is applied to a step-down type switching power supply.

FIG. 1 is a circuit structure diagram illustrating a first embodiment in which the present invention is applied to a step-down type switching power supply. Hereinafter, the embodiment of the present invention is described with reference to the drawings. A switching power supply 1 of this structural example is a well-known step-down type switching power supply that steps down an input voltage Vin supplied to an input terminal VIN so as to output a desired output voltage Vout to an output terminal VOUT.

The switching power supply 1 includes an output transistor 2 (p-channel transistor in the example of this diagram), a synchronous rectification semiconductor element 3 (n-channel transistor in this diagram), a soft-start circuit 4, an offset comparator 5, an error amplifier 6, an oscillation circuit 7, an adding unit 8, a PWM comparator 9, a driving circuit 10, and an inverter 20. The output transistor 2 is prepared as a switching element, and the synchronous rectification semiconductor element 3 is prepared as a synchronous rectification transistor. The output transistor 2 and the synchronous rectification semiconductor element 3 constitute a switching unit that is turned on and off to generate the output voltage Vout from the input voltage Vin. The synchronous rectification semiconductor element may be replaced with a diode instead of the transistor.

Further, a plurality of external terminals (VIN, SW, PGND, AGND, RT, COMP, SS, and FB) provided to the switching power supply 1 are connected to various external voltages or external elements (the input voltage Vin, an inductor L, capacitors C1 to C3, resistors R1 to R4, and a ground potential GND). The switching power supply 1 steps down the input voltage Vin using these external terminals and external elements.

The input terminal VIN applied with the input voltage Vin is connected to the source of the output transistor 2. The drain of the output transistor 2 is connected to the switching terminal SW and the drain of the synchronous rectification semiconductor element 3. The source of the synchronous rectification semiconductor element 3 is connected to the ground potential GND via the ground terminal PGND. The ground terminal PGND connected to the ground potential GND is connected to only the source of the synchronous rectification semiconductor element 3 in which large current flows. The ground terminal AGND provided separately from ground terminal PGND is connected to a circuit portion in which relatively small current flows. The ground terminal AGND is connected to the ground potential GND. This circuit structure enables to prevent a malfunction from occurring in an operation of a circuit portion in which small current flows, due to large current flowing in the synchronous rectification semiconductor element 3.

One terminal of the inductor L is connected to the switching terminal SW. Note that a switching voltage Vsw of a rectangular wave, which is pulse-driven between the input voltage Vin and the ground potential GND, appears at the switching terminal SW. The other terminal of the inductor L is connected to the output terminal VOUT and one terminal of the capacitor C3. The other terminal of the capacitor C3 is connected to the ground potential GND. The capacitor C3 smooths electromagnetic energy accumulated in the inductor L.

The resistors R1 and R2 connected in series between the output terminal VOUT and the ground potential GND work as a feedback voltage generation circuit. The resistors R1 and R2 output a feedback voltage Vfb at their connection node. The feedback voltage Vfb is applied to a noninventing input terminal (+) of the offset comparator 5 and an inverting input terminal (−) of the error amplifier 6 via the feedback terminal FB.

The soft-start circuit 4 is constituted of a resistor, a capacitor C2, and a switching element, for example, and generates a soft-start voltage Vss having a triangular waveform or a sawtooth waveform. The capacitor C2 as a part of the soft-start circuit 4 is externally connected to the soft-start terminal SS. One terminal of the capacitor C2 is connected to the soft-start terminal SS, and the other terminal thereof is connected to the ground potential GND. By selecting a capacitance value of the capacitor C2, the amplitude and gradient of the triangular waveform of the soft-start voltage Vss can be adjusted.

When the switching power supply 1 is activated, the soft-start circuit 4 starts to charge the capacitor C2 connected to the soft-start terminal SS. The voltage charged to the capacitor C2 is input to the soft-start circuit 4 via the soft-start terminal SS and is output as the soft-start voltage Vss. The maximum amplitude and gradient of the soft-start voltage Vss are set by appropriately setting a capacitance value of the capacitor C2 and a constant current value and a resistance value for charging the capacitor C2. With this soft-start circuit 4, when the switching power supply 1 is activated, using the soft-start voltage Vss that mildly increases, output feedback control of the feedback voltage Vfb following the same is performed, and hence an overshoot of the output voltage Vout or a rush current into the capacitor C3 can be prevented. The soft-start circuit 4 is reset by an overcurrent protection signal OCP, for example. For example, if a short circuit to ground occurs, i.e. if the switching terminal SW or the feedback terminal FB contacts with the ground potential GND, so that an overcurrent flows in the output transistor 2, the soft-start voltage Vss is reset to low level L.

The offset comparator 5 compares, for example, the soft-start voltage Vss (Vss−ΔV in this diagram) input to the inverting input terminal (−) with the feedback voltage Vfb input to the noninverting input terminal (+), and according to the comparison result, the offset comparator 5 outputs an offset detection signal SSH of high level ("H") or low level ("L") via the inverter 20. When a potential difference between the soft-start voltage Vss and the feedback voltage Vfb (i.e. Vss−Vfb) is larger than a predetermined offset voltage ΔV (e.g. 300 mV), the offset detection signal SSH outputs, e.g., high level ("H") to the driving circuit 10 in post-stage. When the potential difference (i.e. Vss-Vfb) is smaller than the offset voltage ΔV, it outputs low level ("L"). The feedback voltage Vfb is 0.6 V to 5 V, for example. Note that the offset voltage ΔV may be set outside of the offset comparator 5, but in one example of the present invention, it is set inside the offset comparator 5. Note that an internal circuit of the offset comparator 5 and its circuit operation will be described later.

The error amplifier 6 compares the feedback voltage Vfb with the soft-start voltage Vss or a first reference voltage Vref1, whichever is lower, and the error amplifier 6 outputs an error signal Verr according to the comparison result. A first noninverting input terminal (+) of the error amplifier 6 is applied with the soft-start voltage Vss, a second noninverting input terminal (+) is applied with the first reference voltage Vref1, while the inverting input terminal (−) is applied with the feedback voltage Vfb. The error amplifier 6 outputs the error signal Verr to an inverting input terminal (−) of the PWM comparator 9 according to the signals or voltages input to the input terminals.

A signal path connecting the output of the error amplifier 6 and the inverting input terminal (−) of the PWM comparator 9 is provided with the phase compensation terminal COMP. The resistor R4 and the capacitor C1 are connected in series between the phase compensation terminal COMP and the ground potential GND.

The resistor R4 and the capacitor C1 connected in series between the phase compensation terminal COMP and the ground potential GND are constituted as a phase compensation circuit. The resistor R4 and the capacitor C1 are used for setting a gain (voltage gain) and frequency characteristics of the error amplifier 6. This phase compensation circuit corrects frequency characteristics of the switching power supply 1.

The oscillation circuit 7 is constituted of, for example, a well-known CR oscillator or a ring oscillator in which inverters or differential amplifiers are connected in a ring shape. The oscillation circuit 7 generates a clock signal CLK and a ramp signal Vramp. The clock signal CLK is supplied as a set signal Sset to the driving circuit 10 in post-stage. The ramp signal Vramp is a fundamental signal for generating a slope signal Vslope that is generated based on the clock signal CLK and is supplied to the PWM comparator 9 in post-stage. Note that an oscillation frequency of the clock signal CLK and the ramp signal Vramp can be arbitrarily set by adjusting the resistance value of the resistor R3 connected between the external terminal RT and the ground terminal.

The adding unit 8 performs addition of the ramp signal Vramp and a voltage component corresponding to a switching current Isw supplied via a signal line curr, so as to generate the slope signal Vslope and output it to a noninverting input terminal (+) of the PWM comparator 9. The slope signal Vslope output from the adding unit 8 is a signal to which the voltage component corresponding to the switching current Isw flowing in the output transistor 2 is added, so that the switching power supply 1 works in a current mode control method.

The PWM comparator 9 compares the slope signal Vslope input to the noninverting input terminal (+) with the error signal Verr input to the inverting input terminal (−), for example, so as to output a reset signal Sreset corresponding to the comparison result to the driving circuit 10 in post-stage.

The driving circuit 10 receives the set signal Sset, the reset signal Sreset, and the offset detection signal SSH, so as to output a pMOS gate signal Gp that drives the output transistor 2 and an nMOS gate signal Gn that drives the synchronous rectification semiconductor element 3. The pMOS gate signal Gp is supplied to the gate of the output transistor 2, and the nMOS gate signal Gn is supplied to the gate of the synchronous rectification semiconductor element 3.

The driving circuit 10 turns on and off the output transistor 2 and the synchronous rectification semiconductor element 3 in a complementary manner by the pMOS gate signal Gp and the nMOS gate signal Gn. An RS flip-flop (not shown), for example, is disposed inside the driving circuit 10, and a set terminal of the RS flip-flop is supplied with the set signal Sset generated in the oscillation circuit 7, while a reset terminal thereof is supplied with the reset signal Sreset output from the PWM comparator 9.

An operation of the step-down type switching power supply 1 having the above-mentioned structure is described below. In the switching power supply 1 in a step-down mode, when the output transistor 2 is turned on while the synchronous rectification semiconductor element 3 is turned off, current flows from the input terminal VIN to the capacitor C3 via the inductor L, so that magnetic energy is stored. On the contrary, when the output transistor 2 is turned off while the synchronous rectification semiconductor element 3 is turned on, current flows to the capacitor C3 via the synchronous rectification semiconductor element 3 and the inductor L, so that the magnetic energy stored in the inductor L is discharged. With this operation, the input voltage Vin is stepped down, and the output voltage Vout is output from the output terminal OUT. The resistor R1 and the resistor R2 divide the output voltage Vout output from the output terminal VOUT so as to generate the feedback voltage Vfb, which is sent out to the feedback terminal FB.

The driving circuit 10 receives the offset detection signal SSH output from the offset comparator 5 (more properly the inverter 20) and acts to prevent a malfunction that overcurrent flows in the output transistor 2 and the synchronous rectification semiconductor element 3 in post-stage. In other words, when the offset detection signal SSH is at high level ("H") for example, the operation of the switching power supply 1 is stopped by forcibly turning off the output transistor 2. Note that when the offset detection signal SSH is at low level ("L"), the driving circuit 10 outputs the pMOS gate signal Gp and the nMOS gate signal Gn, so as to turn on and off the output transistor 2 and the synchronous rectification semiconductor element 3 in a complementary manner as described above.

In order to prevent excessive through current flowing from the output transistor 2 to the synchronous rectification semiconductor element 3, the driving circuit 10 is provided with a so-called dead time during which the pMOS gate signal Gp is at high level ("H") while the nMOS gate signal Gn is at low level ("L"). During the dead time, both the output transistor 2 and the synchronous rectification semiconductor element 3 are turned off, so that the through current path is blocked.

As described above, the switching power supply 1 of FIG. 1 supplies the offset detection signal SSH to the driving circuit 10 when a potential difference between the feedback voltage Vfb and the soft-start voltage Vss reaches the offset voltage $\Delta V$, so as to prevent a malfunction that overcurrent flows in the output transistor 2 and the synchronous rectification semiconductor element 3 by the driving circuit 10.

Figure 2A:
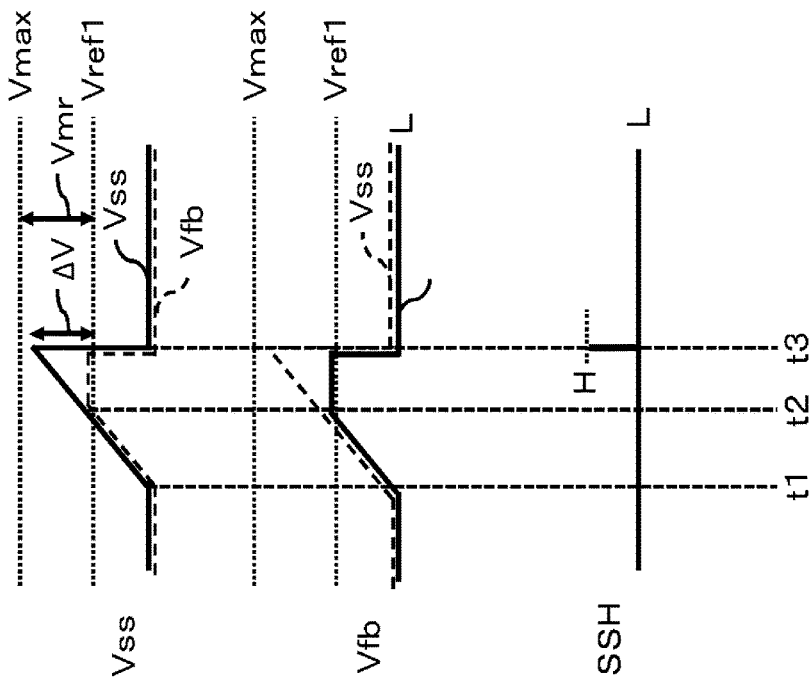
FIG. 2A is a timing chart when provided with an appropriate relationship between an offset voltage and a soft-start voltage supplied to an offset comparator in the switching power supply illustrated in FIG. 1.

FIG. 2A is a timing chart when the switching power supply 1 illustrated in FIG. 1 is in a normal operation. In this description, the "normal operation" of the switching power supply 1 means an operation of the circuit in a state where a short circuit to ground accident has not occurred. In addition, the "short circuit to ground" means a state where the switching terminal SW or the feedback terminal FB contacts with the ground potential GND. However, although not shown, a cased where the feedback voltage Vfb does not stably follow the soft-start voltage Vss so that the potential difference increases to a predetermined value is also dealt as the "short circuit to ground".

In FIG. 2A, the soft-start voltage Vss mildly increases with a constant gradient from time t1 to time t2. The soft-start voltage Vss increases also from time t2 to time t3 with the same gradient as the interval from time t1 to time t2. The soft-start voltage Vss reaches a maximum value Vmax at time t3. A margin voltage Vmr indicating a difference voltage between the maximum value Vmax and the first reference voltage Vref1 is set to be smaller than the offset voltage $\Delta V$ (Vmr<$\Delta V$).

The feedback voltage Vfb follows the increase and decrease of the soft-start voltage Vss. The feedback voltage Vfb increases with a constant gradient in the interval from time t1 to time t2. When the feedback voltage Vfb reaches the first reference voltage Vref1 at time t2, the feedback voltage Vfb is maintained at the same potential as the first reference voltage Vref1 in the interval from time t2 to time t3. Therefore, an upper limit value of the feedback voltage Vfb is set based on the first reference voltage Vref1. This condition setting is also applied to other embodiments described later.

The offset detection signal SSH is output from the offset comparator 5 (more properly the inverter 20). The offset detection signal SSH outputs high level H when the soft-start voltage Vss is higher than a potential (Vfb+$\Delta V$) that is the feedback voltage Vfb plus the offset voltage $\Delta V$, i.e., when Vss>Vfb+$\Delta V$ holds, while it outputs low level L when the soft-start voltage Vss is not higher than the potential (Vfb+$\Delta V$), i.e., when Vss<Vfb+$\Delta V$ holds. The offset detection signal SSH illustrated in FIG. 2A indicates that the soft-start voltage Vss is not higher than the potential (Vfb+$\Delta V$) that is the feedback voltage Vfb plus the offset voltage $\Delta V$, i.e. at low level L in the interval from time t1 to time t3. Therefore, in a normal state where a short circuit to ground has not occurred at the switching terminal SW of the switching power supply 1 illustrated in FIG. 1, the offset detection signal SSH is always at low level L.

Figure 2B:
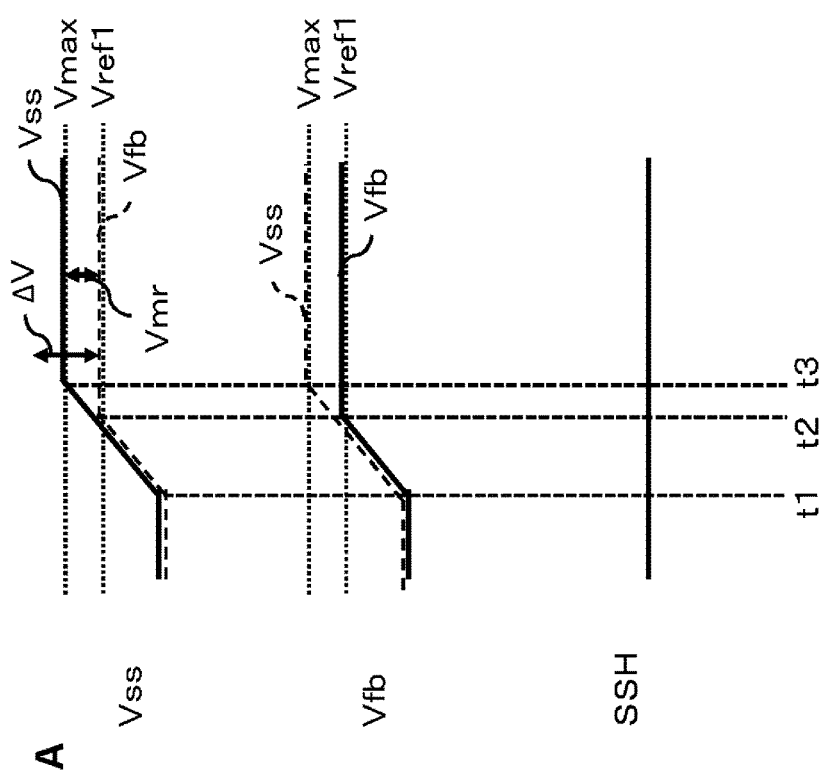
FIG. 2B is a timing chart when not provided with an appropriate relationship between an offset voltage and a soft-start voltage supplied to an offset comparator in the switching power supply illustrated in FIG. 1.

FIG. 2B is a timing chart when the switching power supply 1 is in normal operation in the same manner as in FIG. 2A. FIG. 2B is different from FIG. 2A in that the magnitude relationship between the margin voltage Vmr and the offset voltage $\Delta V$ is inverted. In other words, it shows a case where the magnitude relationship between the margin voltage Vmr and the offset voltage $\Delta V$ is set to satisfy Vmr>$\Delta V$. Under this condition, the behavior is different from that in FIG. 2A.

In FIG. 2B, the soft-start voltage Vss mildly increases with a constant gradient from time t1 to time t2. The soft-start voltage Vss increases also from time t2 to time t3 with the same gradient as the interval from time t1 to time t2. The soft-start voltage Vss is reset to low level L at time t3. The soft-start voltage Vss is reset to low level L because the soft-start circuit 4 is reset by the offset detection signal SSH in an undesired pseudo-short circuit to ground described later.

The feedback voltage Vfb follows the increase and decrease of the soft-start voltage Vss. When the feedback voltage Vfb reaches the first reference voltage Vref1 at time t2, it is maintained at the same potential as the first reference voltage Vref1 until time t3 and drops to low level L at time t3 following the soft-start voltage Vss.

The offset detection signal SSH is low level L at time t1 and time t2, but a spike-like high level H momentarily appears at time t3. This is because the soft-start voltage Vss becomes higher than the potential (Vfb+$\Delta V$) that is the feedback voltage Vfb plus the offset voltage $\Delta V$ at time t3, so that the circuit operation of the offset comparator 5 is inverted. Although the offset detection signal SSH naturally must be low level L in the normal operation, when it is set to satisfy Vmr>$\Delta V$, the spike-like offset detection signal SSH that is a voltage at high level H is generated in the same manner as in the case where a short circuit to ground has occurred.

As described above, when the magnitude relationship between the margin voltage Vmr and the offset voltage $\Delta V$ is set to Vmr>$\Delta V$, there is a malfunction that a pseudo-short circuit to ground occurs, which cannot be discriminated from occurrence of a short circuit to ground. Therefore, in the switching power supply 1 of FIG. 1, it is required that the magnitude relationship between the margin voltage Vmr and the offset voltage $\Delta V$ is set to satisfy Vmr<$\Delta V$.

Figure 3:
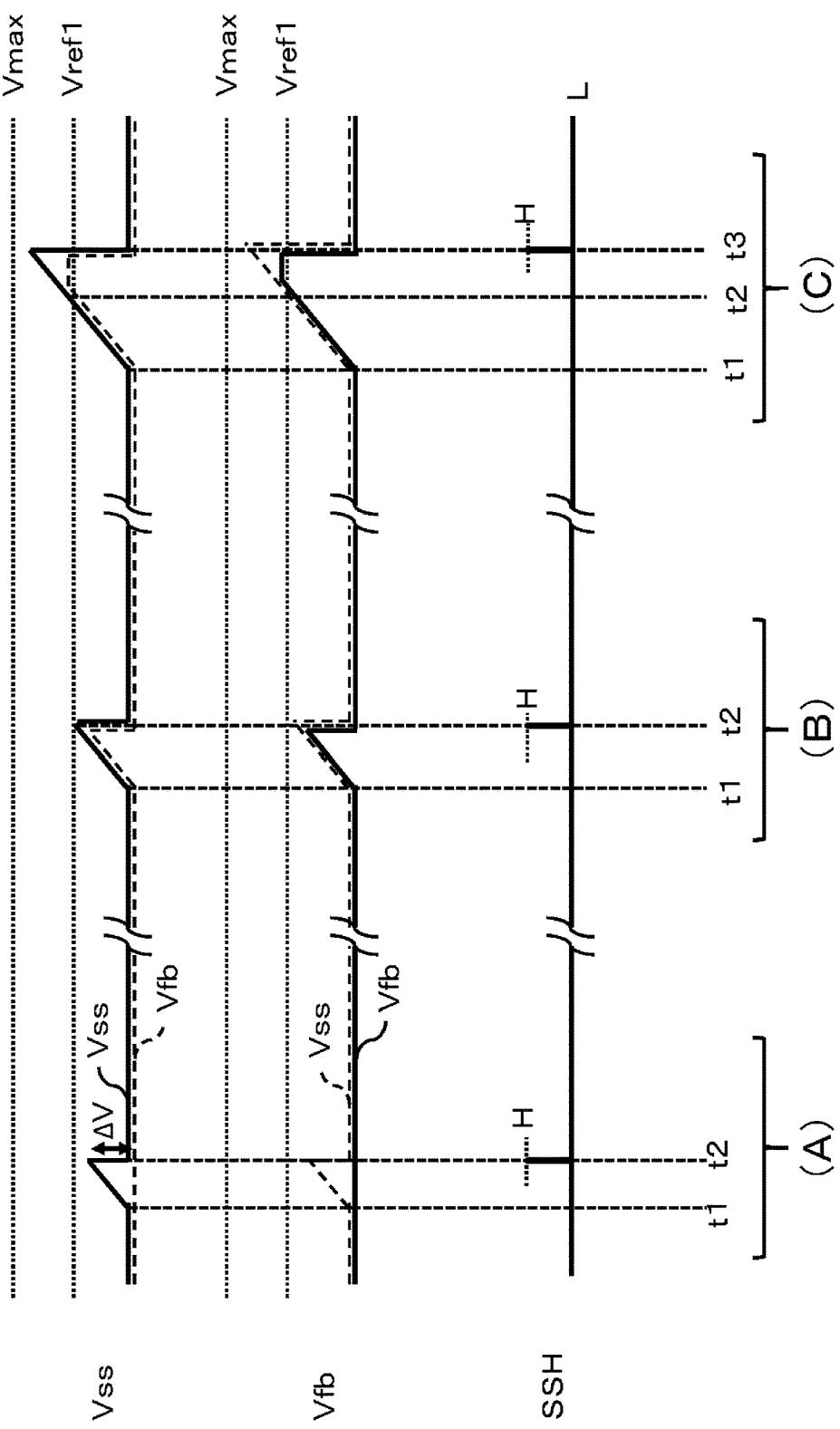
FIG. 3 is a timing chart when a short circuit to ground occurs in the switching power supply illustrated in FIG. 1.

FIG. 3 is a timing chart when supposing a state where the switching terminal SW or the feedback terminal FB of the switching power supply 1 illustrated in FIG. 1 contacts with the ground potential GND (state where a so-called short circuit to ground has occurred). A timing when a short circuit to ground occurs cannot be predicted, but for convenience sake of description, the timing when a short circuit to ground occurs is described by classifying into three states as follows.

A state (A) of FIG. 3 is supposed to be a state where a short circuit to ground has already occurred when the switching power supply 1 is activated (hereinafter referred to as a short circuit to ground state (A)).

In the short circuit to ground state (A), the soft-start voltage Vss mildly increases with a constant gradient from time t1 to time t2. The soft-start voltage Vss does not reach the potential of the first reference voltage Vref1 but is reset to low level L at time t2 when the soft-start voltage Vss reaches the potential of the feedback voltage Vfb (0 V) plus the offset voltage ΔV, i.e. the offset voltage ΔV.

In the short circuit to ground state (A), the feedback voltage Vfb becomes low level L in the interval from time t1 to time t2 regardless of a potential of the soft-start voltage Vss. It is because a voltage is not generated at the feedback terminal FB under the condition that a short circuit to ground has already occurred before time t1 when the soft-start voltage Vss rises.

In the short circuit to ground state (A), the offset detection signal SSH is low level L at time t1. In the offset detection signal SSH, a spike-like high level H is momentarily output at time t2. This is because the soft-start voltage Vss becomes higher than the potential that is the feedback voltage Vfb plus the offset voltage ΔV, so that the output of the offset comparator 5 is changed from low level L to high level H.

A state (B) of FIG. 3 is supposed to be a state where a short circuit to ground has not occurred before the switching power supply 1 is activated (before time t1), but a short circuit to ground occurs at time t2 before the soft-start voltage Vss reaches the first reference voltage Vref1 (hereinafter referred to as a short circuit to ground state (B)).

In the short circuit to ground state (B), the soft-start voltage Vss increases with a constant gradient from time t1 to time t2. When a short circuit to ground occurs at time t2, the soft-start voltage Vss is momentarily reset to low level L. This is because when a short circuit to ground occurs, overcurrent flows in the output transistor 2 so that the soft-start circuit 4 is reset by the overcurrent detection signal OCP output from an overcurrent protection circuit (not shown).

In the short circuit to ground state (B), the feedback voltage Vfb follows the potential of the soft-start voltage Vss and mildly increases with a constant gradient in the interval from time t1 to time t2, and becomes low level L when a short circuit to ground occurs at time t2.

In the short circuit to ground state (B), the offset detection signal SSH is low level L at time t1. When a short circuit to ground occurs at time t2, in the offset detection signal SSH, a spike-like high level H is momentarily output at time t2. This is because the soft-start voltage Vss becomes higher than the potential that is the feedback voltage Vfb plus the offset voltage ΔV, so that the output of the offset comparator 5 is changed from low level L to high level H.

A state (C) of FIG. 3 is supposed to be a state where a short circuit to ground has occurred before the soft-start voltage Vss reaches offset voltage ΔV although it becomes higher than the first reference voltage Vref1 and further becomes higher than the margin voltage Vmr (hereinafter referred to as s short circuit to ground state (C)).

In the short circuit to ground state (C), the soft-start voltage Vss mildly increases with a constant gradient from time t1 to time t3, and is reset to low level L at time t3 when a short circuit to ground occurs.

In the short circuit to ground state (C), the feedback voltage Vfb follows the potential of the soft-start voltage Vss, and increases with a constant gradient in the interval from time t1 to time t2. When the feedback voltage Vfb reaches the first reference voltage Vref1 at time t2, it is maintained at the same potential as the first reference voltage Vref1 in the interval from time t2 to time t3, and it becomes low level L when a short circuit to ground occurs at time t3.

In the short circuit to ground state (C), the offset detection signal SSH is low level L in the interval from time t1 to time t2, and in the offset detection signal SSH, a spike-like high level H is momentarily output at time t3 when a short circuit to ground occurs. This is because the soft-start voltage Vss becomes higher than the potential that is the feedback voltage Vfb plus the offset voltage ΔV, so that the output of the offset comparator 5 is changed from low level L to high level H. Note that the soft-start voltage Vss continues to increase after being the same potential as the feedback voltage Vfb at time t2, and hence the potential difference (Vss-Vfb) between the soft-start voltage Vss and the feedback voltage Vfb increases. However, from time t2 to time t3, it is not still higher than the offset voltage ΔV, and hence the offset detection signal SSH remains at low level L.

Next, an appropriate value of the offset voltage ΔV is considered. When the offset voltage ΔV is too small, noise immunity is deteriorated so that a malfunction is apt to occur. On the other hand, as the offset voltage ΔV is smaller, a time period from occurrence of a short circuit to ground to detection thereof can be shorter so that safety can be higher. In view of this trade-off, it is desired that the offset voltage ΔV is set to satisfy 10 mV<ΔV<Vref/3<Vref (=0.8 V), for example.

Second Embodiment

Figure 4:
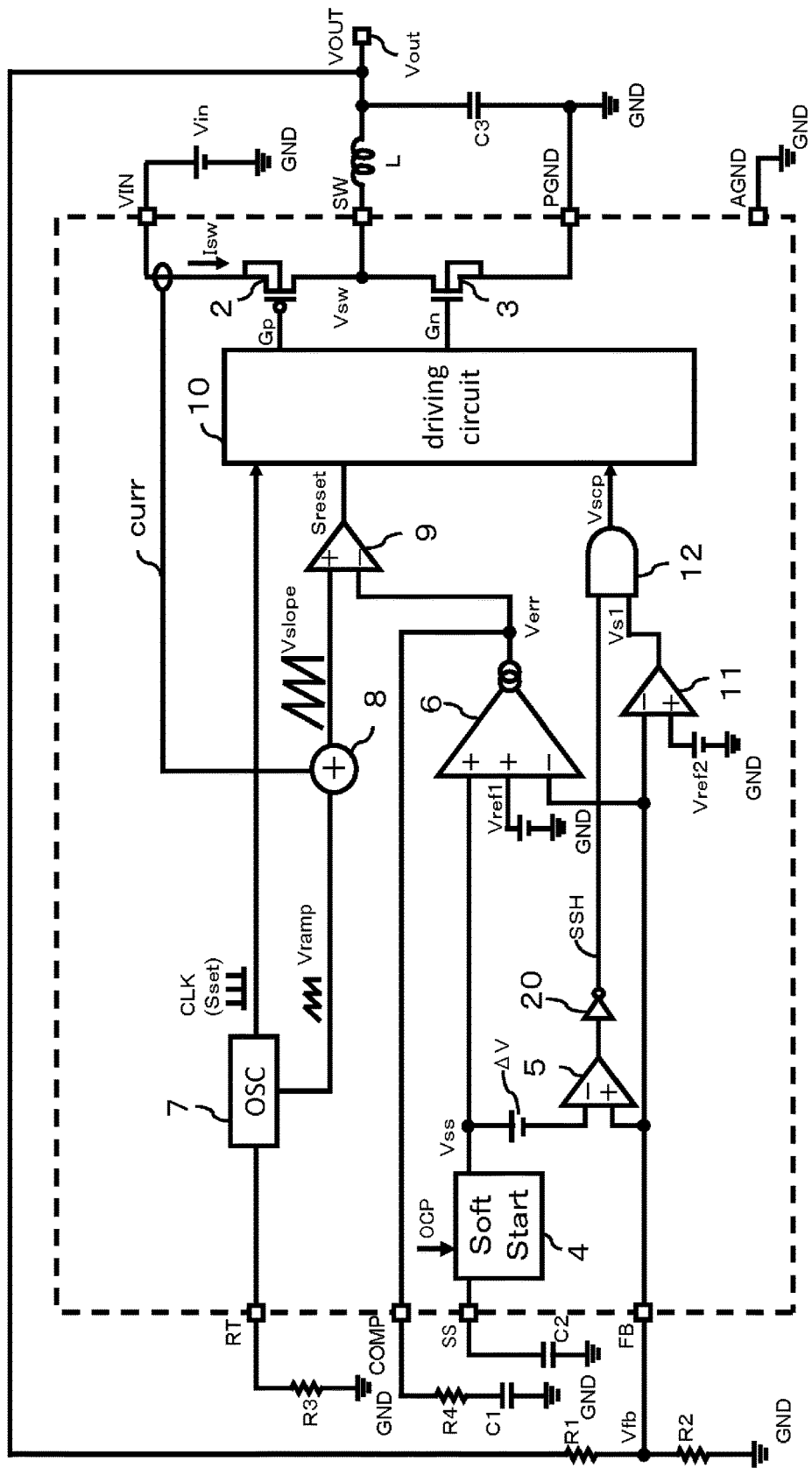
FIG. 4 is a circuit structure diagram illustrating a second embodiment when the present invention is applied to a step-down type switching power supply.

FIG. 4 is a circuit structure diagram illustrating a second embodiment of the step-down type switching power supply according to the present invention. The second embodiment is prepared to solve a problem in the first embodiment described above. A switching power supply 100 according to the second embodiment is different from the switching power supply 1 illustrated in FIG. 1 in that a short-circuit-to-ground detection circuit 11 and an AND circuit 12 are added. Other circuit structure is the same. A circuit structure in FIG. 4 that is different from that in FIG. 1 is described below.

In FIG. 4, the short-circuit-to-ground detection circuit 11 is constituted of a comparator, for example, and an inverting input terminal (−) thereof is applied with the feedback voltage Vfb while a noninverting input terminal (+) thereof is applied with a second reference voltage Vref2. The AND circuit 12 receives the offset detection signal SSH output from the offset comparator 5 (more properly the inverter 20) and a first short-circuit-to-ground detection signal Vs1 output from the short-circuit-to-ground detection circuit 11, so as to output a short protection control signal Vscp to the driving circuit 10. The short-circuit-to-ground detection circuit 11 is a short-circuit-to-ground detection unit adopted conventionally, compares the feedback voltage Vfb with the second reference voltage Vref2. If the feedback voltage Vfb has not reached a predetermined potential when a predetermined time elapses after the soft-start voltage Vss is activated, it is determined that a short circuit to ground has occurred.

The short-circuit-to-ground detection circuit 11 compares the feedback voltage Vfb with the second reference voltage Vref2, and according to the comparison result, the first short-circuit-to-ground output signal Vs1 of high level ("H") or low level ("L") is output. In other words, the first short-circuit-to-ground output signal Vs1 outputs high level ("H") to the AND circuit 12 if the feedback voltage Vfb is lower than the second reference voltage Vref2, while it outputs low level ("L") to the same if the feedback voltage Vfb is higher than the second reference voltage Vref2.

The AND circuit 12 is a circuit that performs the AND operation of the input offset detection signal SSH and the first short-circuit-to-ground output signal Vs1, and outputs the operation result as the short protection control signal Vscp. When the input offset detection signal SSH and the first short-circuit-to-ground output signal Vs1 are both high level ("H"), the short protection control signal Vscp outputs high level ("H") to the driving circuit 10 in post-stage. If one of the input offset detection signal SSH and the first short-circuit-to-ground detection signal Vs is low level ("L"), or if both the offset detection signal SSH and the first short-circuit-to-ground output signal Vs1 are low level ("L"), the short protection control signal Vscp outputs low level ("L") to the driving circuit 10 in post-stage.

The driving circuit 10 receives the short protection control signal Vscp from the AND circuit 12 and performs a circuit operation of a so-called short protection circuit for preventing a malfunction that current more than a predetermined value (overcurrent) flows in the output transistor 2 or the synchronous rectification semiconductor element 3. In other words, when the first short-circuit-to-ground detection signal Vs1 is high level ("H"), the circuit operation of the switching power supply 1 is stopped. Note that when the short protection control signal Vscp is low level ("L"), the driving circuit 10 performs normal circuit operation control of outputting the pMOS gate signal Gp and the nMOS gate signal Gn so as to turn on and off the output transistor 2 and the synchronous rectification semiconductor element 3 in a complementary manner, as described above.

Figure 5:
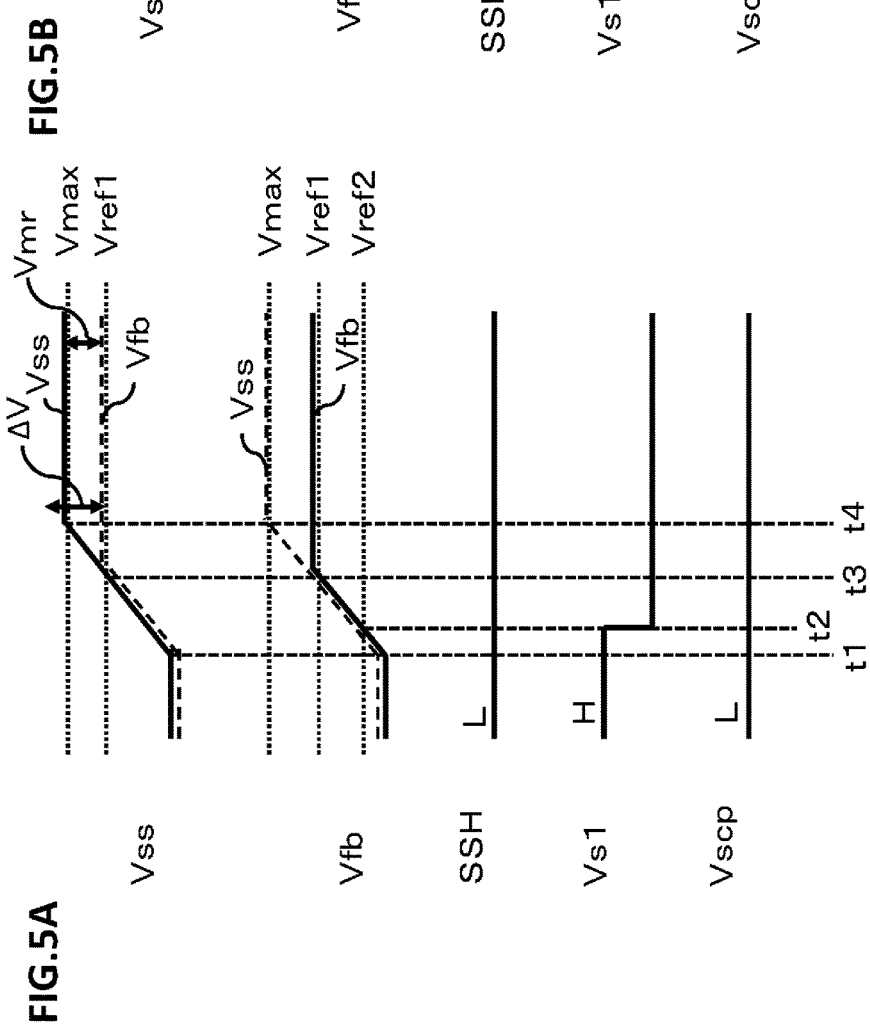
FIG. 5A is a timing chart when provided with an appropriate magnitude relationship between the offset voltage and the soft-start voltage supplied to the offset comparator in a normal operation of the switching power supply illustrated in FIG. 4.
FIG. 5B is a timing chart when the magnitude relationship between the offset voltage and the soft-start voltage supplied to the offset comparator is deviated from an appropriate range in the normal operation of the switching power supply illustrated in FIG. 4.

FIG. 5A is a timing chart when the switching power supply 100 illustrated in FIG. 4 performs the normal operation. FIG. 5A illustrates a case where the offset voltage ΔV is set to a value larger than the margin voltage Vmr (ΔV>Vmr). This condition is the same as described above with reference to FIG. 2A.

The normal operation in this description means a circuit operation without a short circuit to ground accident. In addition, the short circuit to ground means a state in which the switching terminal SW or the feedback terminal FB contacts with the ground potential GND.

In FIG. 5A, the soft-start voltage Vss mildly increases with a constant gradient from time t1 to time t4. At time t4, the soft-start voltage Vss reaches the maximum value Vmax, which is the first reference voltage Vref1 plus the margin voltage Vmr.

The feedback voltage Vfb follows the increase and decrease of the soft-start voltage Vss. The feedback voltage Vfb mildly increases with a constant gradient in the interval from time t1 to time t3. The feedback voltage Vfb becomes higher than the second reference voltage Vref2 at time t2, reaches the first reference voltage Vref1 at time t3, and then is maintained at the same potential as the first reference voltage Vref1 in the interval until time t4.

The offset detection signal SSH is output from the offset comparator 5 (more properly the inverter 20). The offset detection signal SSH outputs high level H when the soft-start voltage Vss is higher than the potential (Vfb+ΔV) that is the feedback voltage Vfb plus the offset voltage ΔV, i.e. when Vss>Vfb+ΔV holds, while it outputs low level L when the soft-start voltage Vss is not higher than the same, i.e. when Vss<Vfb+ΔV holds. Note that, as described above, the upper limit of the feedback voltage Vfb is restricted by the first reference voltage Vref1.

The offset detection signal SSH illustrated in FIG. 5A indicates that the soft-start voltage Vss is not higher than the potential (Vfb+ΔV) that is the feedback voltage Vfb plus the offset voltage ΔV, i.e. it is low level L in the interval from time t1 to time t4.

The first short-circuit-to-ground output signal Vs1 is output from the short-circuit-to-ground detection circuit 11 by comparison between the feedback voltage Vfb and the second reference voltage Vref2. The first short-circuit-to-ground output signal Vs1 becomes high level H when the feedback voltage Vfb is lower than the second reference voltage Vref2, while it becomes low level L when the feedback voltage Vfb is higher than the second reference voltage Vref2. Therefore, the first short-circuit-to-ground output signal Vs1 becomes high level H in the interval from time t1 to time t2 and becomes low level L in the interval from time t2 to time t4.

The short protection control signal Vscp is generated by an AND operation between the offset detection signal SSH and the first short-circuit-to-ground output signal Vs1. The short protection control signal Vscp outputs low level L in the entire interval from time t1 to time t4. When the short protection control signal Vscp is at low level L, control of the driving circuit 10 is not affected. Therefore, the driving circuit 10 performs normal circuit operation control for turning on and off the output transistor 2 and the synchronous rectification semiconductor element 3 in a complementary manner.

In the same manner as FIG. 5A, the FIG. 5B is a timing chart when the switching power supply 100 illustrated in FIG. 4 performs the normal operation, i.e., when a short circuit to ground has not occurred. Unlike FIG. 5A, FIG. 5B is supposed to be a state where the magnitude relationship between the margin voltage Vmr and the offset voltage ΔV is set to satisfy Vmr>ΔV. In other words, it is a case where the maximum value Vmax of the soft-start voltage Vss is set to a value higher than the potential that is the feedback voltage Vfb plus the offset voltage ΔV (Vmax>Vfb+ΔV). This state is shown as an unfavorable example in FIG. 2B described above.

In FIG. 5B, the soft-start voltage Vss mildly increases with a constant gradient from time t1 to time t2. The soft-start voltage Vss increases also from time t2 to time t5 with the same gradient as the interval from time t1 to time t2. Note that the soft-start voltage Vss reaches the same potential as the first reference voltage Vref1 at time t3, reaches the potential that is the first reference voltage Vref1 plus the offset voltage ΔV (i.e. Vref1+ΔV) at time t4, and reaches the maximum value Vmax at time t5.

The feedback voltage Vfb follows the increase and decrease of the soft-start voltage Vss. The feedback voltage Vfb starts to increase at time t1, and reaches the second reference voltage Vref2 at time t2. In addition, after the feedback voltage Vfb reaches the first reference voltage Vref1 at time t3, its potential is maintained until time t4 and further until time t5.

The offset detection signal SSH is output from the offset comparator 5 (more properly the inverter 20). The offset detection signal SSH is low level L in the interval from time t1 to time t4, and becomes high level H after time t4 when the soft-start voltage Vss becomes higher than the potential that is the feedback voltage Vfb plus the offset voltage ΔV. This logical level transition is a behavior that does not occur in FIG. 5A described above.

The first short-circuit-to-ground output signal Vs1 is output as a result of comparison by the short-circuit-to-ground detection circuit 11 between the feedback voltage Vfb and the second reference voltage Vref2. The first short-circuit-to-ground output signal Vs1 becomes high level H when the feedback voltage Vfb is lower than the second reference voltage Vref2, while it becomes low level L when the feedback voltage Vfb is higher than the second reference voltage Vref2. Therefore, the first short-circuit-to-ground output signal Vs1 becomes high level H before time t2 and becomes low level L after time t2. The second reference voltage Vref2 is set to a potential lower than the first reference voltage Vref1. In this way, the first short-circuit-to-ground output signal Vs1 is output earlier, and a time margin can be secured until the timing when the offset detection signal SSH is generated. Thus, the AND operation in the AND circuit 12 can be appropriately performed.

The short protection control signal Vscp is generated by an AND operation by the AND circuit 12 between the offset detection signal SSH and the first short-circuit-to-ground output signal Vs1. The short protection control signal Vscp outputs low level L in the interval from time t1 to time t5. When the short protection control signal Vscp is low level L, the control of the driving circuit 10 is not affected. Therefore, the driving circuit 10 performs the normal circuit operation control for turning on and off the output transistor 2 and the synchronous rectification semiconductor element 3 in a complementary manner.

FIG. 5B illustrates a case where the magnitude relationship between the margin voltage Vmr and the offset voltage ΔV is supposed to satisfy Vmr>ΔV, which is an unfavorable condition in the switching power supply 1 of FIG. 1. Also under this condition, unlike the switching power supply 1 of FIG. 1, the switching power supply 100 of FIG. 4 can perform a natural appropriate circuit operation.

Figure 6:
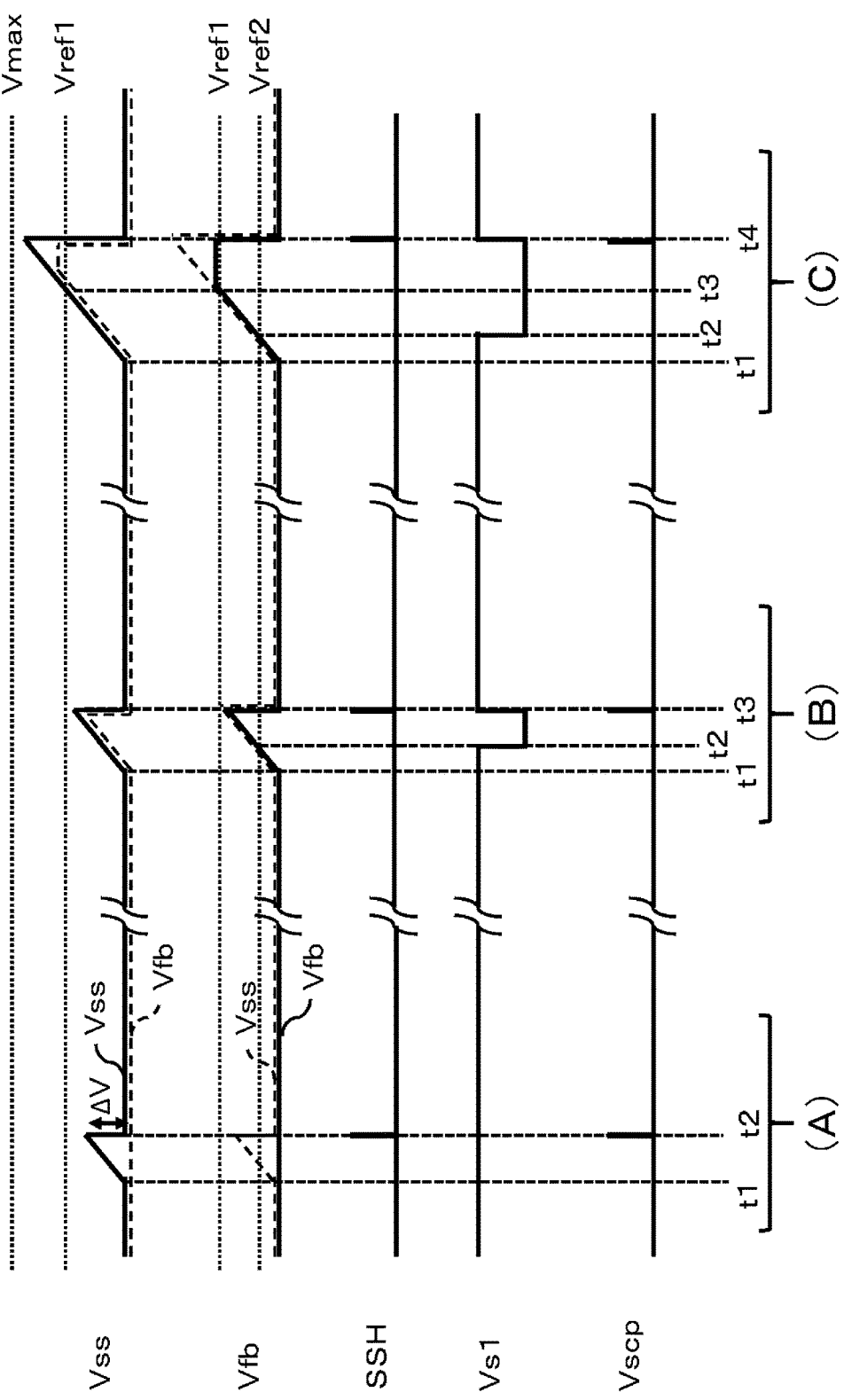
FIG. 6 is a timing chart when a short circuit to ground occurs in the switching power supply illustrated in FIG. 4.

FIG. 6 is a timing chart supposing a state in which the switching terminal SW or the feedback terminal FB of the switching power supply 100 illustrated in FIG. 4 contacts with the ground potential GND (state in which a so-called short circuit to ground has occurred). This short circuit to ground state is roughly classified into the following three states (A) to (C) and is described with reference to FIG. 4.

In the state (A) of FIG. 6, it is supposed that a short circuit to ground has already occurred before the switching power supply 100 is activated (hereinafter referred to as a short circuit to ground state (A)).

In the short circuit to ground state (A), the soft-start voltage Vss mildly increases with a constant gradient from time t1 to time t2. The soft-start voltage Vss is reset to low level L at time t2 when reaching the offset voltage ΔV. This reset is performed by the overcurrent protection signal OCP.

In the short circuit to ground state (A), the feedback voltage Vfb becomes low level L in the interval from time t1 to time t2 regardless of the potential of the soft-start voltage Vss. It is because a short circuit to ground has already occurred before the soft-start voltage Vss rises, and hence no voltage is generated at the feedback terminal FB.

In the short circuit to ground state (A), the offset detection signal SSH is low level L at time t1. At time t2, a spike-like high level H is momentarily output in the offset detection signal SSH. This is because the soft-start voltage Vss becomes higher than the potential that is the feedback voltage Vfb plus the offset voltage ΔV so that the output of the offset comparator 5 is inverted from low level L to high level H.

The first short-circuit-to-ground output signal Vs1 maintains high level H in the interval from time t1 to time t2. This is because the first short-circuit-to-ground output signal Vs1 is output based on comparison between the feedback voltage Vfb and the second reference voltage Vref2, but the feedback voltage Vfb is always low level L due to a short circuit to ground, and hence the second reference voltage Vref2 applied to the noninverting input terminal (+) of the short-circuit-to-ground detection circuit 11 is always higher than the feedback voltage Vfb.

In the short circuit to ground state (A), the short protection control signal Vscp is generated by an AND operation by the AND circuit 12 between the offset detection signal SSH and the first short-circuit-to-ground output signal Vs1. The short protection control signal Vscp is low level L at time t1, and a spike-like high level H is output at time t2. During a period while the spike-like high level H is output, the driving circuit 10 turns off the output transistor 2 and the synchronous rectification semiconductor element 3.

A state (B) of FIG. 6 is supposed to be a state where a short circuit to ground has not occurred when the switching power supply 1 is activated (before time t1), but a short circuit to ground occurs at time t3 before the soft-start voltage Vss reaches the first reference voltage Vref1 (hereinafter referred to as a short circuit to ground state (B)).

In the short circuit to ground state (B), the soft-start voltage Vss increases with a constant gradient from time t1 to time t3. When a short circuit to ground occurs at time t3, the soft-start voltage Vss is reset to low level L by the overcurrent protection signal OCP.

In the short circuit to ground state (B), the feedback voltage Vfb follows the potential of the soft-start voltage Vss, increases with a constant gradient in the interval from time t1 to time t2, and is reset to low level when a short circuit to ground occurs at time t3.

In the short circuit to ground state (B), the offset detection signal SSH is low level L from time t1 to time t2. When a short circuit to ground occurs at time t3, a spike-like high level H is momentarily output in the offset detection signal SSH. This is because the soft-start voltage Vss becomes higher than the potential that is the feedback voltage Vfb plus the offset voltage ΔV, so that the output of the offset comparator 5 is changed from low level L to high level H.

In the short circuit to ground state (B), the first short-circuit-to-ground output signal Vs1 is output as a result of comparison by the short-circuit-to-ground detection circuit 11 between the feedback voltage Vfb and the second reference voltage Vref2. The first short-circuit-to-ground output signal Vs1 becomes high level H when the feedback voltage Vfb is lower than the second reference voltage Vref2, while it becomes low level L when the feedback voltage Vfb is higher than the second reference voltage Vref2. Therefore, the first short-circuit-to-ground output signal Vs1 becomes low level L in the interval from time t2 to time t3, and becomes high level H before time t1 and after time t3.

The short protection control signal Vscp is generated by an AND operation by the AND circuit 12 between the offset detection signal SSH and the first short-circuit-to-ground output signal Vs1. The short protection control signal Vscp outputs low level L in the interval from time t1 to time t2. When reaching time t3, there is a timing when the offset detection signal SSH and the first short-circuit-to-ground output signal Vs1 are both high level H, and hence a spike-like high level H is output in the short protection control signal Vscp. During a period while the spike-like high level H is output in the short protection control signal Vscp, the driving circuit 10 turns off the output transistor 2 and the synchronous rectification semiconductor element 3.

A state (C) of FIG. 6 is supposed to be a state where a short circuit to ground has occurred after the soft-start voltage Vss becomes higher than the first reference voltage Vref1 (hereinafter referred to as a short circuit to ground state (C)).

In the short circuit to ground state (C), the soft-start voltage Vss mildly increases with a constant gradient from time t1 to time t4, and is reset to low level L at time t4 when a short circuit to ground occurs.

The feedback voltage Vfb follows the potential of the soft-start voltage Vss, increases with a constant gradient in the interval from time t1 to time t3, and is maintained at the same potential as the first reference voltage Vref1 in the interval from time t3 to time t4. The upper limit of the feedback voltage Vfb is set by the first reference voltage Vref1.

The offset detection signal SSH is low level L in the interval from time t1 to time t3, and a spike-like high level H is momentarily output to the offset detection signal SSH at time t4 when the short circuit to ground occurs. This is because the soft-start voltage Vss becomes higher than the potential that is the feedback voltage Vfb plus the offset voltage ΔV so that the output of the offset comparator 5 is inverted from low level L to high level H. Note that the soft-start voltage Vss continues to increase also after reaching the feedback voltage Vfb (i.e., the first reference voltage Vref1) at time t3, and hence the potential difference (=Vss−Vfb) between the soft-start voltage Vss and the feedback voltage Vfb increases. However, the soft-start voltage Vss is not higher than the potential (Vref1+ΔV) that is the feedback voltage Vfb (i.e. the first reference voltage Vref1) plus the offset voltage ΔV from time t3 to time t4, and hence the offset detection signal SSH is maintained at low level L.

In the short circuit to ground state (C), the first short-circuit-to-ground output signal Vs1 becomes high level H when the feedback voltage Vfb is lower than the second reference voltage Vref2, and becomes low level L when the feedback voltage Vfb is higher than the second reference voltage Vref2. Therefore, the first short-circuit-to-ground output signal Vs1 becomes low level L in the interval from time t2 to time t4, and becomes high level H before time t2 and after time t4.

The short protection control signal Vscp outputs low level L in the interval from time t1 to time t3. When reaching time t4, there is a timing when the offset detection signal SSH and the first short-circuit-to-ground output signal Vs1 are both high level H, and hence a spike-like high level H is output to the short protection control signal Vscp. During the period while the spike-like high level H is output, the driving circuit 10 turns off the output transistor 2 and the synchronous rectification semiconductor element 3.

In the above description, a short circuit to ground state of the switching power supply 100 of FIG. 4 is supposed, with reference to the states (A) to (C) in FIG. 6. In any case where a short circuit to ground has occurred, detection of a short circuit to ground is not performed until the soft-start voltage Vss becomes higher than the offset voltage ΔV. The same is true not only for FIG. 4 (second embodiment) but also for FIG. 1 (first embodiment) described above.

Third Embodiment

Figure 7:
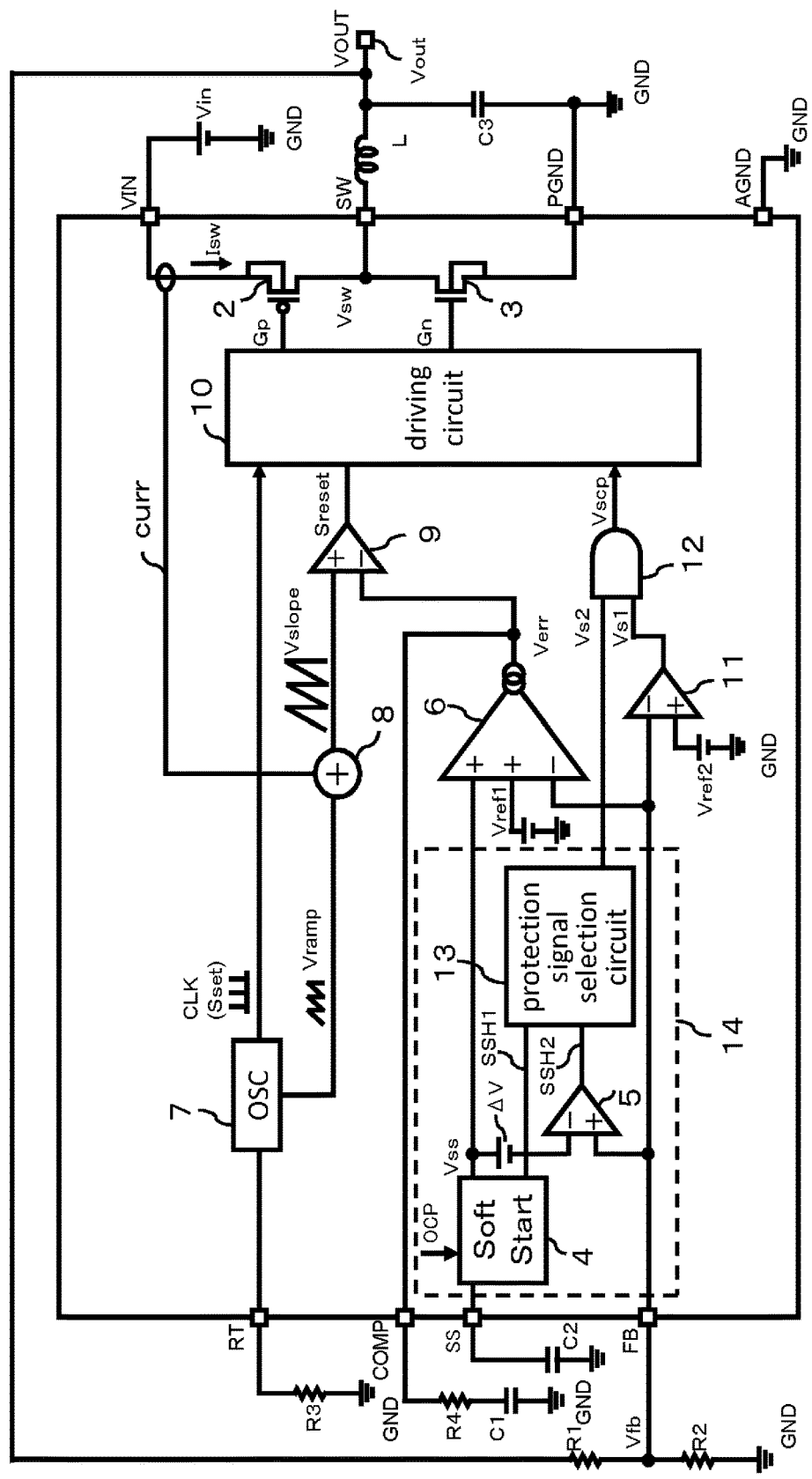
FIG. 7 is a circuit structure diagram illustrating a third embodiment when the present invention is applied to the step-down type switching power supply.

FIG. 7 is a circuit structure diagram illustrating a third embodiment in which the present invention is applied to a step-down type switching power supply. FIG. 7 is different from FIG. 4 illustrating the second embodiment in that a protection signal selection circuit 13 is newly disposed. In addition, it is also different in that the soft-start circuit 4 supplies a short-circuit-to-ground detection signal SSH1 to the protection signal selection circuit 13. Further, it is also different in that a second short-circuit-to-ground output signal Vs2 extracted from the protection signal selection circuit 13 is input to one of input terminals of the AND circuit 12. Other circuit structure is the same. The circuit structure of FIG. 7 different from that of FIG. 4 is described below.

The protection signal selection circuit 13 has a function as a multiplexer. Supposing that the signal output from the soft-start circuit 4 is the short-circuit-to-ground detection signal SSH1 while the output of the offset comparator 5 is an offset detection signal SSH2, these two signals are individually received by two input sides, one of them is selected, and from the output side the second short-circuit-to-ground output signal Vs2 is output to the AND circuit 12 in post-stage. The reason why the protection signal selection circuit 13 is provided with the function as the multiplexer will be described later.

The short-circuit-to-ground detection signal SSH1 is a signal that is not adopted in the first embodiment and the second embodiment illustrated in FIGS. 1 and 4, respectively. In other words, the short-circuit-to-ground detection signal SSH1 is not a signal extracted from the offset comparator 5 side but a signal extracted from the soft-start circuit 4 side. The short-circuit-to-ground detection signal SSH1 is a signal that is changed from low level L to high level H when the soft-start voltage Vss reaches the first reference voltage Vref1, regardless of a timing when a short circuit to ground occurs.

The AND circuit 12 receives the inputs of the first short-circuit-to-ground output signal Vs1 and the second short-circuit-to-ground output signal Vs2 that is output from the protection signal selection circuit 13, and outputs the short protection control signal Vscp to the driving circuit 10 in post-stage.

The first short-circuit-to-ground output signal Vs1 is a signal for comparing the feedback voltage Vfb with the second reference voltage Vref2 so as to detect presence or absence of a short circuit to ground state, as described above.

Note that the soft-start circuit 4, the offset comparator 5, and the protection signal selection circuit 13, which are enclosed by a broken line in this diagram, work as a short-circuit-to-ground output signal generation portion 14 for generating the second short-circuit-to-ground output signal Vs2.

Figure 8:
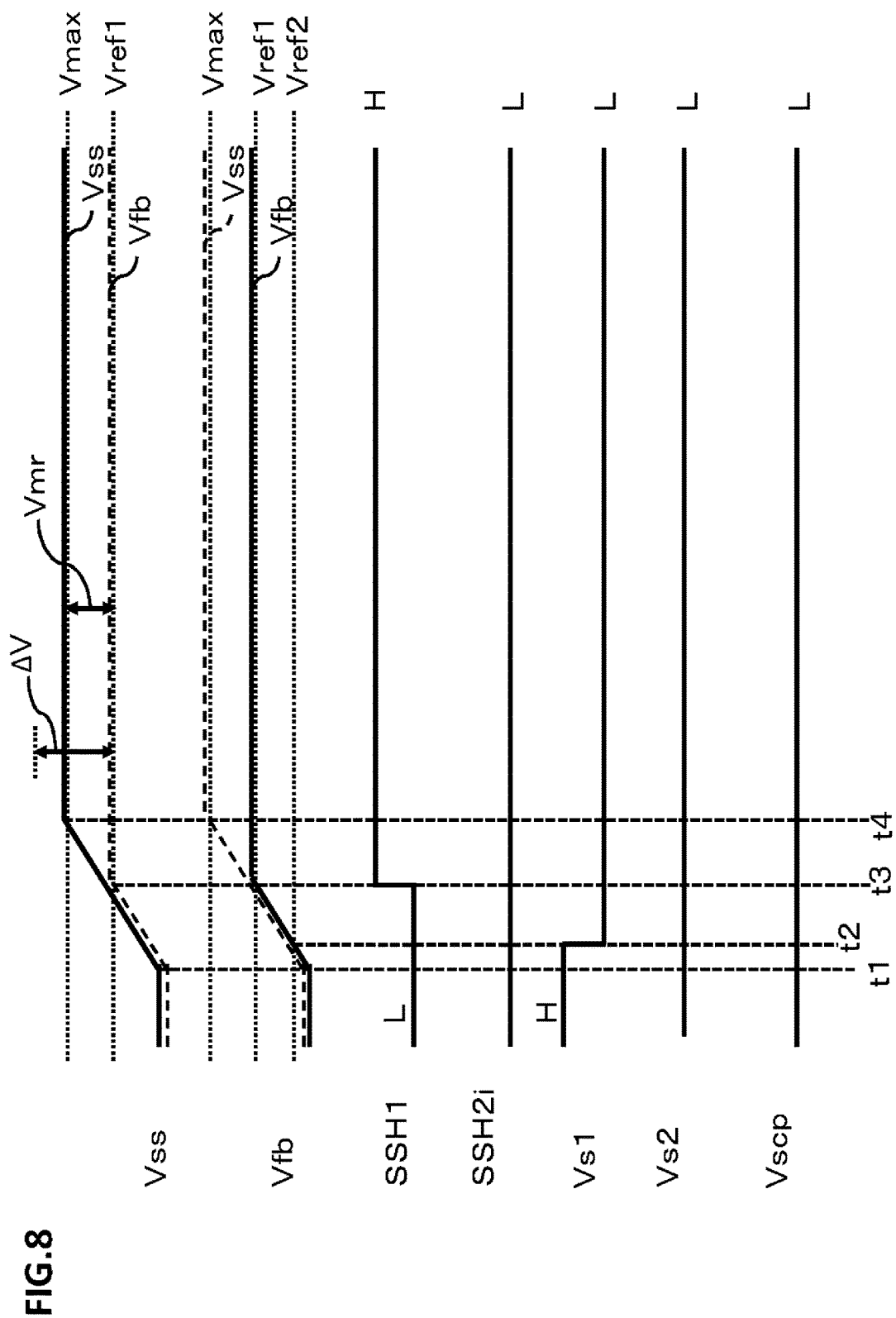
FIG. 8 is a timing chart when the switching power supply illustrated in FIG. 7 is in the normal operation.

FIG. 8 is a timing chart when a switching power supply 1000 illustrated in FIG. 7 performs normal operation.

In FIG. 8, the soft-start voltage Vss mildly increases with a constant gradient from time t1 to time t4. The soft-start voltage Vss reaches the first reference voltage Vref1 at time t3 and reaches the maximum value Vmax at time t4.

The feedback voltage Vfb follows the increase and decrease of the soft-start voltage Vss. The feedback voltage Vfb mildly increases with a constant gradient in the interval from time t1 to time t2. When it reaches the first reference voltage Vref1 at time t3, it is maintained at the same potential as the first reference voltage Vref1 in the interval until time t4.

The short-circuit-to-ground detection signal SSH1 is output from the soft-start circuit 4. The short-circuit-to-ground detection signal SSH1 is changed from low level L to high level H at time t3 when the soft-start voltage Vss reaches the first reference voltage Vref1. Therefore, if the short-circuit-to-ground detection signal SSH1 is selected and output as the second short-circuit-to-ground output signal Vs2, the first short-circuit-to-ground output signal Vs1 is masked until the soft-start voltage Vss reaches the first reference voltage Vref1. In other words, the short-circuit-to-ground detection signal SSH1 can be understood as a mask signal for masking a short-circuit-to-ground detection result of the short-circuit-to-ground detection circuit 11 for a predetermined period.

An offset detection inversion signal SSH2i illustrated in FIG. 8 is a logical inversion signal of the offset detection signal SSH2 output from the offset comparator 5 (more properly the inverter 20) and is generated in the protection signal selection circuit 13 (details will be described later). In other words, the offset detection inversion signal SSH2i is a logically inverted signal of the comparison result signal between the soft-start voltage Vss and the feedback voltage Vfb. If the magnitude relationship between the offset voltage ΔV and the margin voltage Vmr is set to satisfy ΔV>Vmr, the offset detection inversion signal SSH2i becomes low level L regardless of time in the normal operation of the switching power supply 1000.

The first short-circuit-to-ground output signal Vs1 is output as a result of comparison between the feedback voltage Vfb and the second reference voltage Vref2. The first short-circuit-to-ground output signal Vs1 becomes high level H when the feedback voltage Vfb is lower than the second reference voltage Vref2, while it becomes low level L when the feedback voltage Vfb is higher than the second reference voltage Vref2. Therefore, the first short-circuit-to-ground output signal Vs1 becomes high level H in the interval from time t1 to time t2 and becomes low level L in the interval from time t2 to time t4.

The second short-circuit-to-ground output signal Vs2 is the same as the offset detection inversion signal SSH2i selected by the protection signal selection circuit 13. Therefore, the second short-circuit-to-ground output signal Vs2 is always low level L regardless of time.

The short protection control signal Vscp is generated by an AND operation between the first short-circuit-to-ground output signal Vs1 and the second short-circuit-to-ground output signal Vs2. The short protection control signal Vscp outputs low level L in the entire interval from time t1 to time t4. If the short protection control signal Vscp is low level L, control of the driving circuit 10 is not affected, and hence the driving circuit 10 performs the normal circuit operation control for turning on and off the output transistor 2 and the synchronous rectification semiconductor element 3 in a complementary manner.

Figure 9:
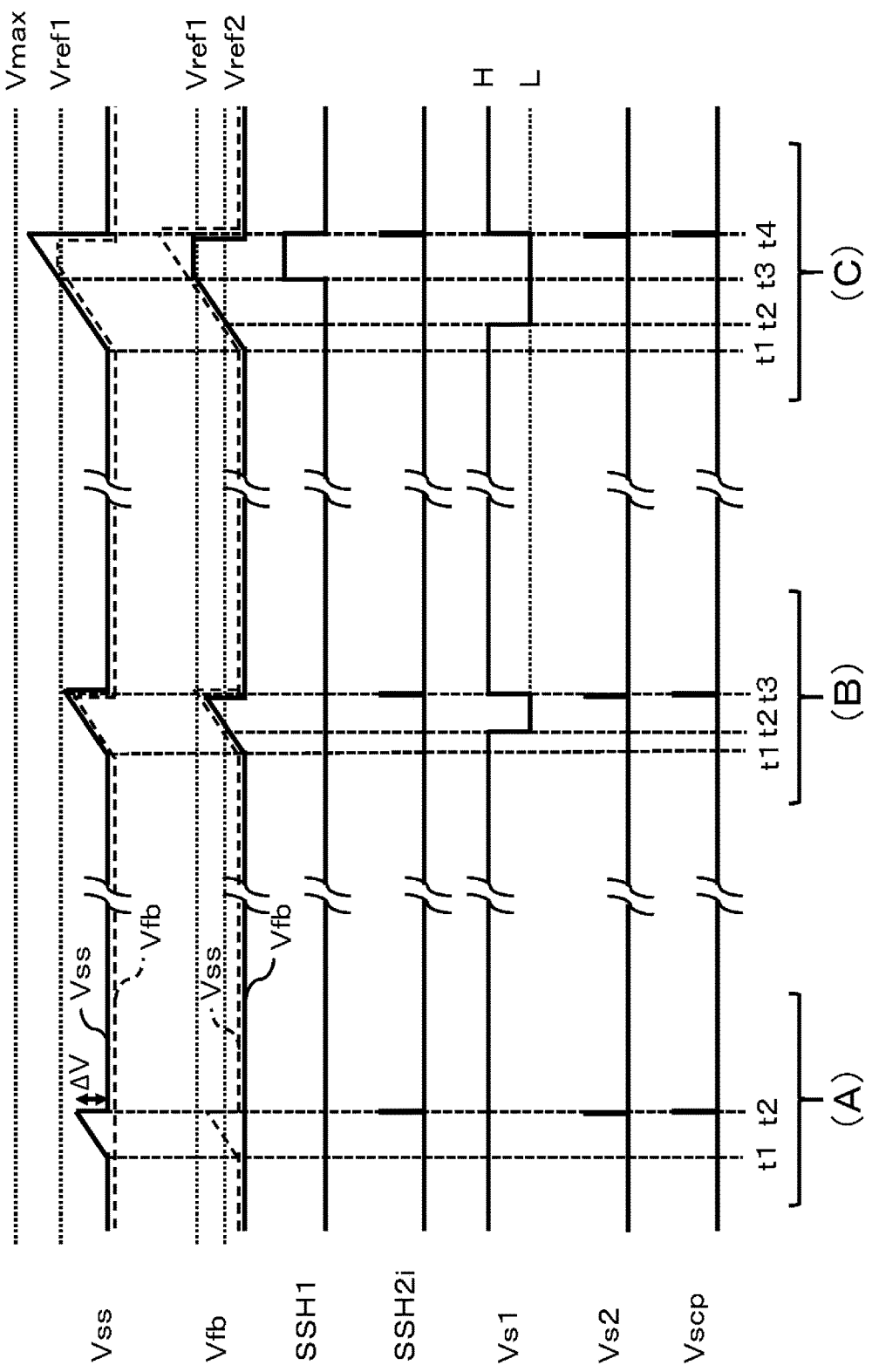
FIG. 9 is a timing chart when a short circuit to ground occurs in the switching power supply illustrated in FIG. 7.

FIG. 9 is a timing chart when supposing a state in which the switching terminal SW or the feedback terminal FB of the switching power supply 1000 illustrated in FIG. 7 contacts with the ground potential GND (state where a so-called short circuit to ground has occurred). This short circuit to ground state is roughly classified into the following three states and is described with reference to FIG. 7.

A state (A) in FIG. 9 is supposed to be a state in which a short circuit to ground has already occurred before the switching power supply 100 is activated (hereinafter referred to as a short circuit to ground state (A)).

In the short circuit to ground state (A), the soft-start voltage Vss mildly increases with a constant gradient from time t1 to time t2. The soft-start voltage Vss is reset to low level L at time t2 when it reaches the offset voltage ΔV.

The feedback voltage Vfb becomes low level L in the interval from time t1 to time t2 regardless of the potential of the soft-start voltage Vss. It is because a short circuit to ground has already occurred before the soft-start voltage Vss rises, and hence the voltage is not generated at the feedback terminal FB.

The short-circuit-to-ground detection signal SSH1 is low level L from time t1 to time t2. This is because the short-circuit-to-ground detection signal SSH1 generates high level H from the soft-start circuit 4 when the soft-start voltage Vss becomes higher than the first reference voltage Vref1. When using the short-circuit-to-ground detection signal SSH1 as the second short-circuit-to-ground output signal Vs2, the short-circuit-to-ground detection function using the first short-circuit-to-ground output signal Vs1 is masked until the soft-start voltage Vss reaches the first reference voltage Vref1.

The offset detection inversion signal SSH2i is low level L at time t1. A spike-like high level H is output to the offset detection inversion signal SSH2i at time t2. This is because the soft-start voltage Vss becomes higher than the potential (Vfb+ΔV) that is the feedback voltage Vfb plus the offset voltage ΔV, and the offset detection signal SSH2 as the output of the offset comparator 5 is changed from high level H to low level L.

The first short-circuit-to-ground output signal Vs1 is output as a result of comparison between the feedback voltage Vfb and the second reference voltage Vref2. The first short-circuit-to-ground output signal Vs1 becomes high level H when the feedback voltage Vfb is lower than the second reference voltage Vref2, while it becomes low level L when the feedback voltage Vfb is higher than the second reference voltage Vref2. Therefore, the first short-circuit-to-ground output signal Vs1 is always high level H. It is because the feedback voltage Vfb is always low level L due to a short circuit to ground, and the second reference voltage Vref2 is always higher than the feedback voltage Vfb.

The second short-circuit-to-ground output signal Vs2 is the same as the offset detection inversion signal SSH2i selected by the protection signal selection circuit 13. Therefore, a spike-like high level H is output to the second short-circuit-to-ground output signal Vs2 at time t2.

The short protection control signal Vscp is output by an AND operation by the AND circuit 12 between the first short-circuit-to-ground output signal Vs1 and the second short-circuit-to-ground output signal Vs2. The short protection control signal Vscp is low level L at time t1, and a spike-like high level H is output at time t2. During the period while the spike-like high level H is output to the short protection control signal Vscp, the driving circuit 10 turns off the output transistor 2 and the synchronous rectification semiconductor element 3 so as to prevent a malfunction that overcurrent flows in them.

A state (B) of FIG. 9 is supposed to be a state in which a short circuit to ground has not occurred when the switching power supply 1 is activated (before time t1), but a short circuit to ground has occurred at time t3 before the soft-start voltage Vss reaches the first reference voltage Vref1 (hereinafter referred to as a short circuit to ground state (B)).

In the short circuit to ground state (B), the soft-start voltage Vss mildly increases with a constant gradient from time t1 to time t2. When a short circuit to ground occurs at time t3, the soft-start voltage Vss is momentarily reset to low level L.

The feedback voltage Vfb follows the potential of the soft-start voltage Vss and increases with a constant gradient in the interval from time t1 to time t2, but is reset to low level L when a short circuit to ground occurs at time t3.

The short-circuit-to-ground detection signal SSH1 is low level L in the entire interval from time t1 to time t3. As described above, the short-circuit-to-ground detection signal SSH1 rises to high level H when the soft-start voltage Vss reaches the first reference voltage Vref1, but the soft-start voltage Vss has not reached the first reference voltage Vref1 at time t3 in the example of this diagram, and hence the short-circuit-to-ground detection signal SSH1 does not rise to high level H.

The offset detection inversion signal SSH2i is low level L until time t2. A spike-like high level H is momentarily output to the offset detection inversion signal SSH2i at time t3. This is because a short circuit to ground has occurred at time t3 so that the feedback voltage Vfb is decreased to the ground potential or its vicinity value, and the soft-start voltage Vss becomes higher than the potential (Vfb+ΔV) that is the feedback voltage Vfb plus the offset voltage ΔV, resulting that the offset detection signal SSH2 as the output of the offset comparator 5 is changed from high level H to low level L.

The first short-circuit-to-ground output signal Vs1 is output as a result of comparison between the feedback voltage Vfb and the second reference voltage Vref2. The first short-circuit-to-ground output signal Vs1 becomes high level H when the feedback voltage Vfb is lower than the second reference voltage Vref2, while it becomes low level L when the feedback voltage Vfb is higher than the second reference voltage Vref2. Therefore, the first short-circuit-to-ground output signal Vs1 becomes low level L in the interval from time t2 to time t3 and becomes high level H at time t1.

The second short-circuit-to-ground output signal Vs2 maintains low level L in the interval from time t1 to time t2, and a spike-like high level H is generated at time t3. The second detection signal Vs2 corresponds to the offset detection inversion signal SSH2i selected by the protection signal selection circuit 13, and hence these two signals are the same.

The short protection control signal Vscp is output by an AND operation by the AND circuit 12 between the first short-circuit-to-ground output signal Vs1 and the second short-circuit-to-ground output signal Vs2. The timing when high level H is output to the short protection control signal Vscp is consequently the same as the timing when high level H is output to the offset detection inversion signal SSH2i.

A state (C) of FIG. 9 is supposed to be a state in which a short circuit to ground has occurred after the soft-start voltage Vss becomes higher than the first reference voltage Vref1 (hereinafter referred to as a short circuit to ground state (C)).

In the short circuit to ground state (C), the soft-start voltage Vss mildly increases with a constant gradient from time t1 to time t4 and is reset to low level L at time t4 when a short circuit to ground has occurred.

The feedback voltage Vfb follows the potential of the soft-start voltage Vss, mildly increases with a constant gradient in the interval from time t1 to time t3, and is maintained at the same potential as the first reference voltage Vref1 in the interval from time t3 to time t4. The upper limit of the feedback voltage Vfb is set by the first reference voltage Vref1.

The short-circuit-to-ground detection signal SSH1 is low level L in the interval from time t1 to time t3 and rises to high level H at time t3 when the soft-start voltage Vss becomes higher than the first reference voltage Vref1. After that, the short-circuit-to-ground detection signal SSH1 is maintained at high level H until time t4 when the soft-start voltage Vss is reset.

The offset detection inversion signal SSH2i is low level L from time t1 to time t3. A spike-like high level H is output to the offset detection inversion signal SSH2i at time t4. This is because the soft-start voltage Vss becomes higher than the potential (Vfb+ΔV) that is the feedback voltage Vfb plus the offset voltage ΔV, and the offset detection signal SSH2 as the output of the offset comparator 5 is changed from high level H to low level L. It is supposed that a short circuit to ground has occurred at time t4 when the soft-start voltage Vss becomes higher than the potential (Vfb+ΔV) that is the feedback voltage Vfb plus the offset voltage ΔV, and hence the above operation holds.

The first short-circuit-to-ground output signal Vs1 is high level H at time t1 and becomes low level L in the interval from time t2 to time t4. The first short-circuit-to-ground output signal Vs1 is output by comparison between the feedback voltage Vfb and the second reference voltage Vref2, and it becomes low level L when Vfb>Vref2 holds while it becomes high level H when Vfb<Vref2 holds.

The second short-circuit-to-ground output signal Vs2 is low level L from time t1 to time t3, a spike-like high level H is output at time t4, and consequently it becomes the same as the offset detection inversion signal SSH2i. This is because the protection signal selection circuit 13 selects the offset detection inversion signal SSH2i as the second short-circuit-to-ground output signal Vs2.

The short protection control signal Vscp is generated by an AND operation between the first short-circuit-to-ground output signal Vs1 and the second short-circuit-to-ground output signal Vs2. Therefore, the short protection control signal Vscp consequently becomes the same as the second short-circuit-to-ground output signal Vs2 to become low level L from time t1 to time t3, and a spike-like high level H is output at time t4. In this way, a spike-like high level H is output to the short protection control signal Vscp at time t4, and as a result, it becomes the same as the offset detection inversion signal SSH2i. When a spike-like high level H is generated in the short protection control signal Vscp, the output transistor 2 and the synchronous rectification semiconductor element 3 are forcibly turned off via the driving circuit 10 during a period while the spike-like high level H is generated.

The description with reference to FIG. 9 is supposed that a short circuit to ground is generated in each of three timings in the third embodiment of the present invention illustrated in FIG. 7. In any case in the third embodiment, in the same manner as the first and second embodiments, a short circuit to ground is detected by comparison between the feedback voltage Vfb and the soft-start voltage Vss. When the soft-start voltage Vss reaches the potential that is the feedback voltage Vfb plus the offset voltage ΔV, the short-circuit-to-ground detection signal is generated.

Relatively large number of short-circuit-to-ground detection circuits are used in this type of switching power supplies. For example, the short-circuit-to-ground detection circuit 11 illustrated in FIG. 7 is one of them. The short-circuit-to-ground detection circuit 11 compares the feedback voltage Vfb with the second reference voltage Vref2. When a short circuit to ground occurs, the feedback voltage Vfb becomes low level L. Therefore if voltage of the feedback voltage Vfb is a predetermined voltage or lower, it can be determined that a short circuit to ground has occurred. In addition, it is also possible to use the short-circuit-to-ground detection signal SSH1 output from the soft-start circuit 4 of FIG. 7 so as to mask the short-circuit-to-ground detection. The structure of combination of the first short-circuit-to-ground detection method (i.e. the method of using the short-circuit-to-ground detection signal SSH1 so as to mask the short-circuit-to-ground detection) and the second short-circuit-to-ground detection method (i.e. the method of using the offset detection signal SSH2 so as to mask the short-circuit-to-ground detection) will be described later with reference to FIG. 10.

The first short-circuit-to-ground detection method is described briefly above and is summarized as below. In the first short-circuit-to-ground detection method, the short-circuit-to-ground detection is masked during a relatively long period until the soft-start voltage Vss reaches the first reference voltage Vref1. In other words, even if the switching power supply is activated, notification of occurrence of a short circuit to ground is masked until the soft-start voltage Vss reaches the first reference voltage Vref1, and hence control for the short circuit to ground is not performed. As a merit of this first short-circuit-to-ground detection method, protection against a short circuit to ground is performed at timing when the soft-start voltage Vss reaches the first reference voltage Vref1, and hence the output voltage of the switching power supply is relatively stable. Thus, a variation or fluctuation of the output voltage is small, and hence it is possible to reduce an effect to a load. On the other hand, as a demerit thereof, because overcurrent flows in the output transistor 2 for relatively long period, deterioration of the output transistor 2 is accelerated. The merit of the first short-circuit-to-ground detection method is adopted in one embodiment of the present invention, which is a circuit structure of FIG. 10 illustrating a variation of FIG. 7.

Figure 10:
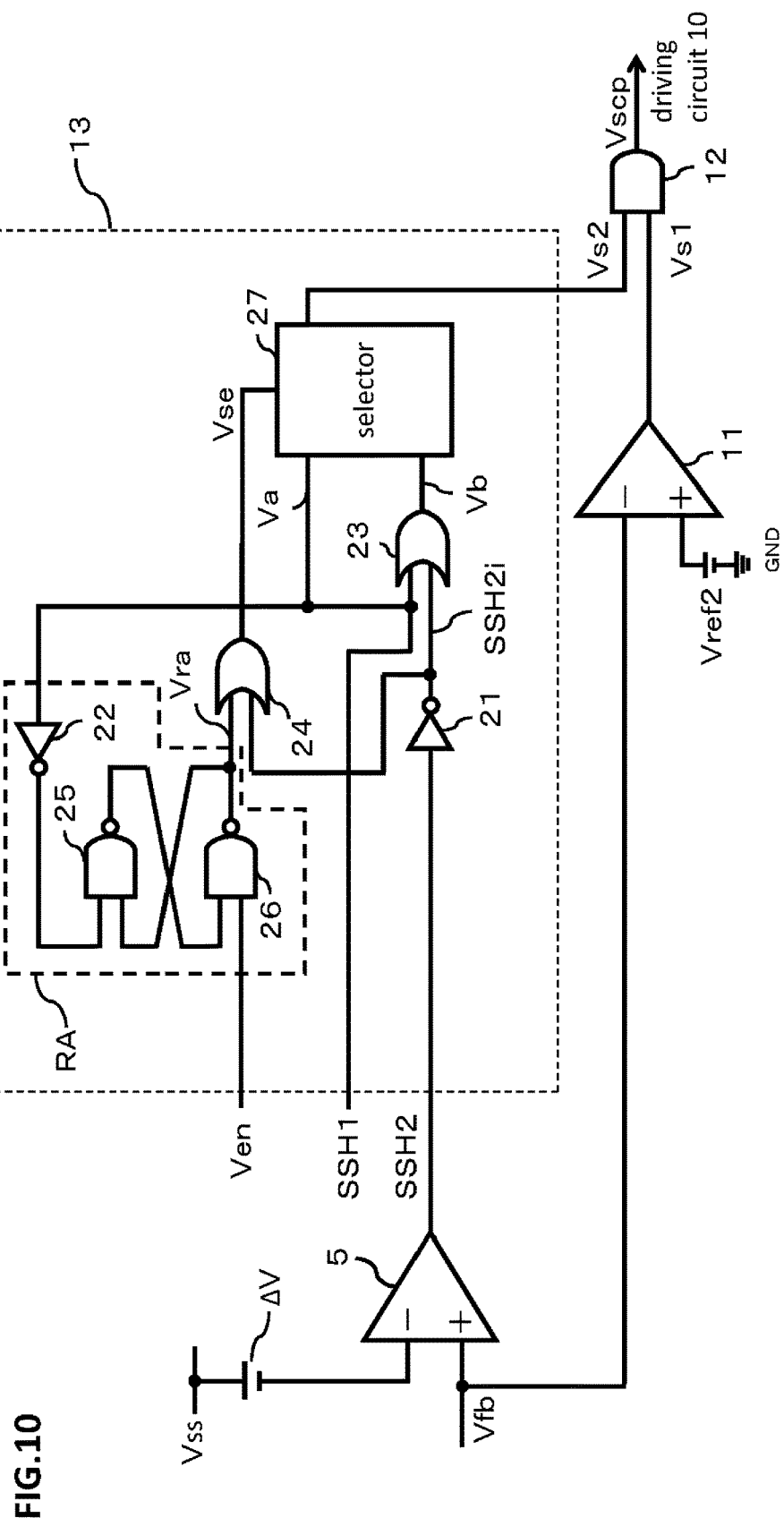
FIG. 10 is a circuit diagram illustrating a specific circuit connection of a protection signal selection circuit 13 adopted in the switching power supply of FIG. 7.

FIG. 10 is a circuit diagram illustrating a specific circuit structure of the protection signal selection circuit 13 illustrated in FIG. 7, which is also a variation of the third embodiment illustrated in FIG. 7. The protection signal selection circuit 13 illustrated in FIG. 10 is directly explained as follows. When the switching power supply 1000 is activated, after an enable signal Ven is input from low level L to high level H, for example, detection of a first occurrence of a short circuit to ground is performed by using the first short-circuit-to-ground detection method, i.e. the short-circuit-to-ground detection signal SSH1 illustrated in FIG. 7 as the second short-circuit-to-ground output signal Vs1 so as to detect a short circuit to ground, and a subsequent occurrence of a short circuit to ground in a state where the enable signal Ven is effective is detected by switching to the second short-circuit-to-ground detection method using the offset voltage ΔV described above with reference to FIGS. 1, 4, and 7. In other words, the protection signal selection circuit 13 illustrated in FIG. 10 is one example of a circuit structure suitable for switching between the first short-circuit-to-ground detection method and the second short-circuit-to-ground detection method.

The protection signal selection circuit 13 includes inverters 21 and 22, OR circuits 23 and 24, NAND circuits 25 and 26, and a selector 27. The selector 27 selects one of a first input signal Va and a second input signal Vb according to a selection signal Vse and outputs it as the second short-circuit-to-ground output signal Vs2 to the AND circuit 12.

A latch circuit RA is provided for processing the short-circuit-to-ground detection signal SSH1, and the offset detection signal SSH2 that detects a short circuit to ground by the offset voltage ΔV is excluded from being processed. The latch circuit RA is constituted of the NAND circuits 25 and 26 and the inverter 22. The latch circuit RA is a well-known two-input NAND gate R-S latch circuit. The enable signal Ven is applied as one of inputs to the latch circuit RA, and the short-circuit-to-ground detection signal SSH1 is applied as the other input via the inverter 22. The enable signal Ven is used for activating the switching power supply 1000. The output signal of the latch circuit RA is output as a latch output Vra from the output terminal of the NAND circuit 26 and is applied to one of input terminals of the OR circuit 24. Note that the latch circuit RA may not a NAND circuit but may be constituted as a combination of a NOR circuit and inverters as necessary.

The other input terminal of the OR circuit 24 is applied with the second short-circuit-to-ground detection signal SSH2. The OR circuit 24 performs an OR operation between the latch output Vra and the second short-circuit-to-ground detection signal SSH2, and outputs its operation result as the selection signal Vse of the selector 27.

One of input terminals of the OR circuit 23 is applied with the first short-circuit-to-ground detection signal SSH1. The other input terminal of the OR circuit 23 is applied with the second short-circuit-to-ground detection signal SSH2 as the second short-circuit-to-ground detection inversion signal SSH2i via the inverter 21. The OR circuit 23 performs an OR operation between the first short-circuit-to-ground detection signal SSH1 and the second short-circuit-to-ground detection inversion signal SSH2i so as to output the result as the second input signal Vb.

Figure 11:
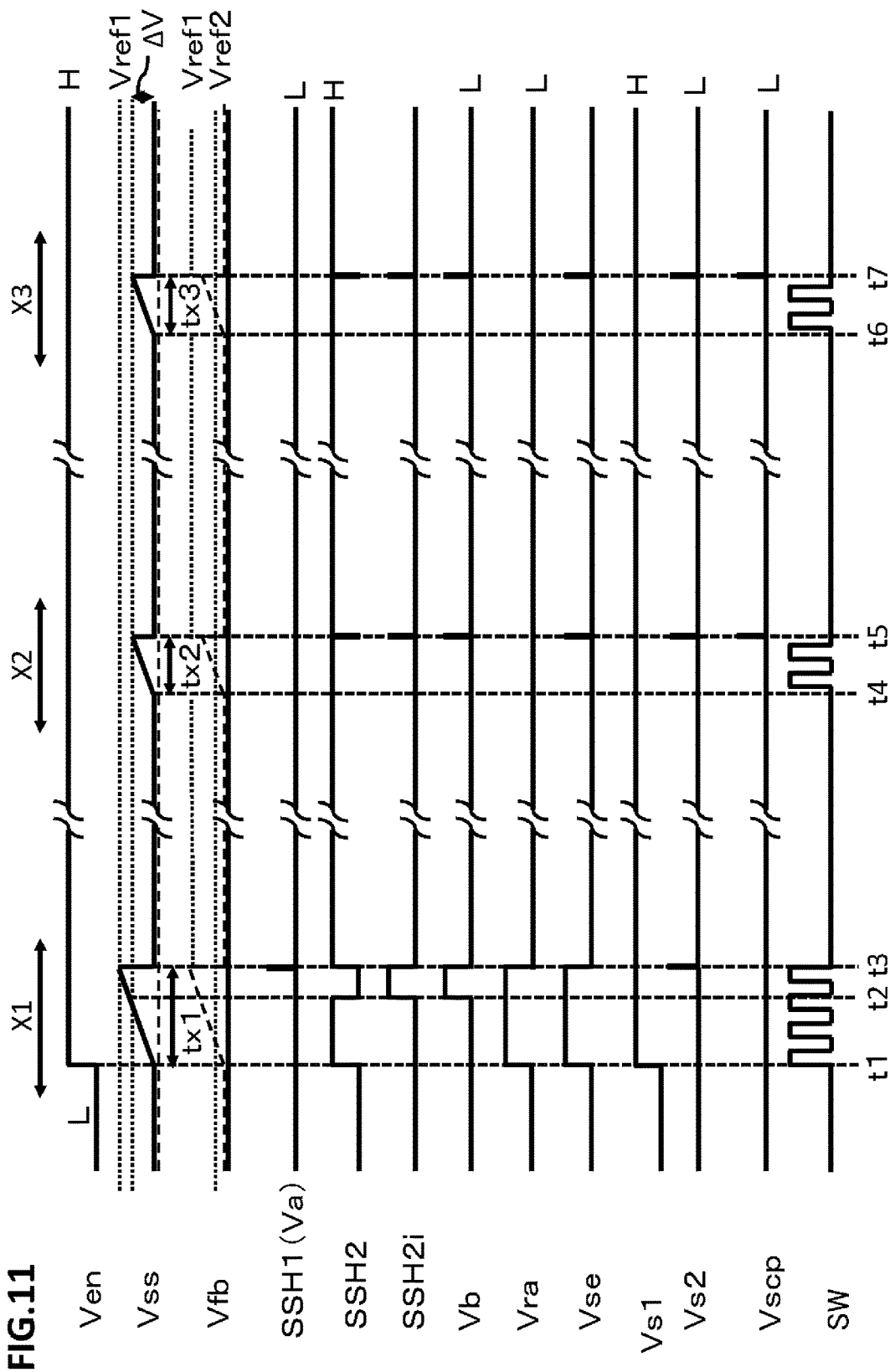
FIG. 11 is a timing chart illustrating one method for detecting a short circuit to ground when a short circuit to ground occurs in the switching power supply illustrated in FIG. 7.

FIG. 11 is a timing chart of various signals appearing at major nodes in FIG. 10. FIG. 11 illustrates three intervals including an interval X1 (time t1 to time t3), an interval X2 (time t4 to time t5), and an interval X3 (time t6 to time t7). After the enable signal Ven is input, in the interval X1 in which a short circuit to ground has occurred for the first time, the first short-circuit-to-ground detection method is adopted. In the state where the enable signal Ven is input, in the interval X2 and the interval X3 indicating the second time and the third time of a short circuit to ground, respectively, the second short-circuit-to-ground detection method using the offset voltage ΔV of the present invention is adopted. Note that in the interval X1, it is supposed that a short circuit to ground has already occurred before reaching time t1. Further, it is supposed that from the interval X1 to the interval X2, i.e. from time t3 to time t4, the short circuit to ground is cancelled, and another short circuit to ground occurs before time t4. The term "cancelled" means that after a short circuit to ground occurs, the short circuit to ground state is cancelled by a certain change of status so that a normal circuit operation state is realized. Further, it is supposed that from the interval X2 to the interval X3, i.e. from time t5 to time t6, the short circuit to ground that has occurred in the interval X2 is cancelled, and then another short circuit to ground occurs before time t6.

Next, a timing chart of the interval X1, the interval X2, and the interval X3 is described. In the interval X1 of FIG. 11, the enable signal Ven is changed from low level L to high level H at time t1. When the enable signal Ven is high level H, the entire switching power supply 1000 becomes an activated state. The enable signal Ven is maintained at high level H in the interval from time t1 to time t7.

The soft-start voltage Vss follows the enable signal Ven so as to mildly increases from time t1, reaches the same potential as the offset voltage ΔV at time t2, and reaches the first reference voltage Vref1 at time t3. The interval from time t1 to time t3 is referred to as time period tx1. The time period tx1 corresponds to a time period after a short circuit to ground occurs until a signal notifying that the short circuit to ground is generated.

Because a short circuit to ground has already occurred before reaching time t1, the feedback voltage Vfb is low level L in the entire interval from time t1 to time t3.

Because the short-circuit-to-ground detection signal SSH1 (Va) becomes high level H at the timing when the soft-start voltage Vss reaches the first reference voltage Vref1, a spike-like high level H is generated at time t3. The short-circuit-to-ground detection signal SSH1 (Va) is prepared for performing the short-circuit-to-ground detection by the first short-circuit-to-ground detection method.

The offset detection signal SSH2 becomes high level H from time t1 to time t2, becomes low level L from time t2 to time t3, and becomes high level H after time t3.

An offset detection inversion signal SSHi is an inversion signal of the offset detection signal SSH2.

The second input signal Vb is generated by an OR operation between the short-circuit-to-ground detection signal SSH1 and the offset detection inversion signal SSH2i.

The latch output Vra is generated from the enable signal Ven and an inversion signal of the short-circuit-to-ground detection signal SSH1. The latch output Vra is high level H in the interval from time t1 to time t3.

The selection signal Vse is generated by an OR operation between the latch output Vra and the offset detection inversion signal SSH2i.

As the second short-circuit-to-ground output signal Vs2, the short-circuit-to-ground detection signal SSH1 is selected by the selector 27, and a spike-like high level H is output at time t3.

The first short-circuit-to-ground output signal Vs' becomes high level H in the interval from time t1 to time t3.

The short protection control signal Vscp is generated by an AND operation between the first short-circuit-to-ground output signal Vs1 and the second short-circuit-to-ground output signal Vs2. It is low level L from time t1 to time t2, and a spike-like high level H is generated at time t3. The spike-like high level H is the signal notifying that a short circuit to ground is generated. The time t3 is a timing when the soft-start voltage Vss reaches the first reference voltage Vref1. Therefore, although a short circuit to ground is generated before time t1 that is before time t3, the generation of the short circuit to ground is notified when the enable signal Ven is input and the short-circuit-to-ground detection time period tx1 elapses after time t1 when the soft-start voltage Vss rises. In other words, the short-circuit-to-ground detection is masked during the time period tx1.

The intervals X2 and X3 in the timing chart of FIG. 11 are supposed that the short circuit to ground generated in the interval X1 is cancelled and second and third short circuits to ground are generated in a state where the enable signal Ven is input.

In the interval X2, the soft-start voltage Vss mildly increases from time t4 to t5. The soft-start voltage Vss is reset to low level L when reaching the same potential as the offset voltage ΔV.

Because it is supposed that a short circuit to ground has already occurred before time t4, the feedback voltage Vfb is low level L in the interval from time t4 to time t5.

The short-circuit-to-ground detection signal SSH1 is low level L during the entire interval. It is because the short-circuit-to-ground detection signal SSH1 becomes high level H first when the soft-start Vss reaches the first reference voltage Vref1, and the soft-start voltage Vss is reset to low level L at time t2 when the soft-start voltage Vss reaches the offset voltage ΔV before the soft-start voltage Vss reaches the first reference voltage Vref1.

The first input signal Va is the same as the short-circuit-to-ground detection signal SSH1 that appears on the same signal line.

The offset detection signal SSH2 is changed from high level H to low level L at time t5 when the soft-start voltage Vss reaches the offset voltage ΔV. In other words, a spike-like low level L is generated in the offset detection signal SSH2 at time t5.

The offset detection inversion signal SSH2i is an inversion signal of the offset detection signal SSH2.

The second input signal Vb is generated by an OR operation between the short-circuit-to-ground detection signal SSH1 and the offset detection inversion signal SSH2i. A spike-like high level is generated in the second input signal Vb at time t5.

The latch output Vra is generated from the enable signal Ven and the short-circuit-to-ground detection signal SSH1 applied to one of input terminals of the NAND circuit 25, and becomes low level L in the interval from time t4 to time t5.

The selection signal Vse is generated by an OR operation between the latch output Vra and the offset detection inversion signal SSH2i, and a spike-like high level is generated at time t5.

As the second short-circuit-to-ground detection signal Vs2, the second input signal Vb is selected and output by the selector 27, and a spike-like high level H is output at time t5.

The first short-circuit-to-ground output signal Vs1 is generated by comparison between the feedback voltage Vfb and the second reference voltage Vref2 by the short-circuit-to-ground detection circuit 11. In the short circuit to ground state, the feedback voltage Vfb is low level L, and the second reference voltage Vref2 is always high and is always maintained at high level H regardless of time.

The short protection control signal Vscp is generated by an AND operation between the first short-circuit-to-ground output signal Vs1 and the second short-circuit-to-ground output signal Vs2. Therefore, it is low level L at time t4, and a spike-like high level H is generated at time t5. The driving circuit 10 is controlled based on the spike-like high level H generated at time t5. In this case, the driving circuit 10 prevents a malfunction that overcurrent flows in the output transistor 2 or the rectification semiconductor element 3.

The interval X3 in the timing chart of FIG. 11 is supposed that the second short circuit to ground generated in the interval X2 is cancelled and then a third short circuit to ground occurs. This is substantially the same as the interval X2, and the short-circuit-to-ground detection using the offset voltage ΔV is performed. Time t6 and time t7 in the interval X3 are respectively replaced with time t4 and time t5 in the interval X2, and further the short-circuit-to-ground detection time period tx3 can be replaced with tx2, and hence detailed description thereof is omitted.

Note that in the lowest section of FIG. 11, a terminal voltage at the switching terminal SW (i.e. an on or off state of the output transistor 2) is shown. As understood from this chart, in the switching power supply 1000 of the second embodiment, the short-circuit-to-ground detection time periods tx2 and tx3 when a short circuit to ground occurs for the second or any succeeding time are set to be shorter than the short-circuit-to-ground detection time period tx1 when a short circuit to ground occurs for the first time (tx1≥tx2 or tx3). Note that each of the short-circuit-to-ground detection time periods tx1 to tx3 can be understood also as a switching time of the output transistor 2.

The circuit operation and the short-circuit-to-ground detection method when the protection signal selection circuit 13 illustrated in FIG. 10 is applied to the switching power supply 1000 illustrated in FIG. 7 is described above with reference to FIG. 11.

The switching power supply according to the present invention is summarized as follows. In the switching power supply 1 and the switching power supply 100 illustrated in FIGS. 1 and 4, when comparing the soft-start voltage Vss with the feedback voltage Vfb for detecting a short circuit to ground, the offset voltage ΔV is involved. On the other hand, in the switching power supply 1000 illustrated in FIG. 7, it is possible to use two methods. One method (X) is to use only the method of involving the offset voltage ΔV in the same manner as in FIGS. 1 and 4 so as to perform the short-circuit-to-ground detection. The other method (Y) is to combine the method without involving the offset voltage ΔV and the method of involving the offset voltage ΔV so as to perform the short-circuit-to-ground detection.

Figure 12:
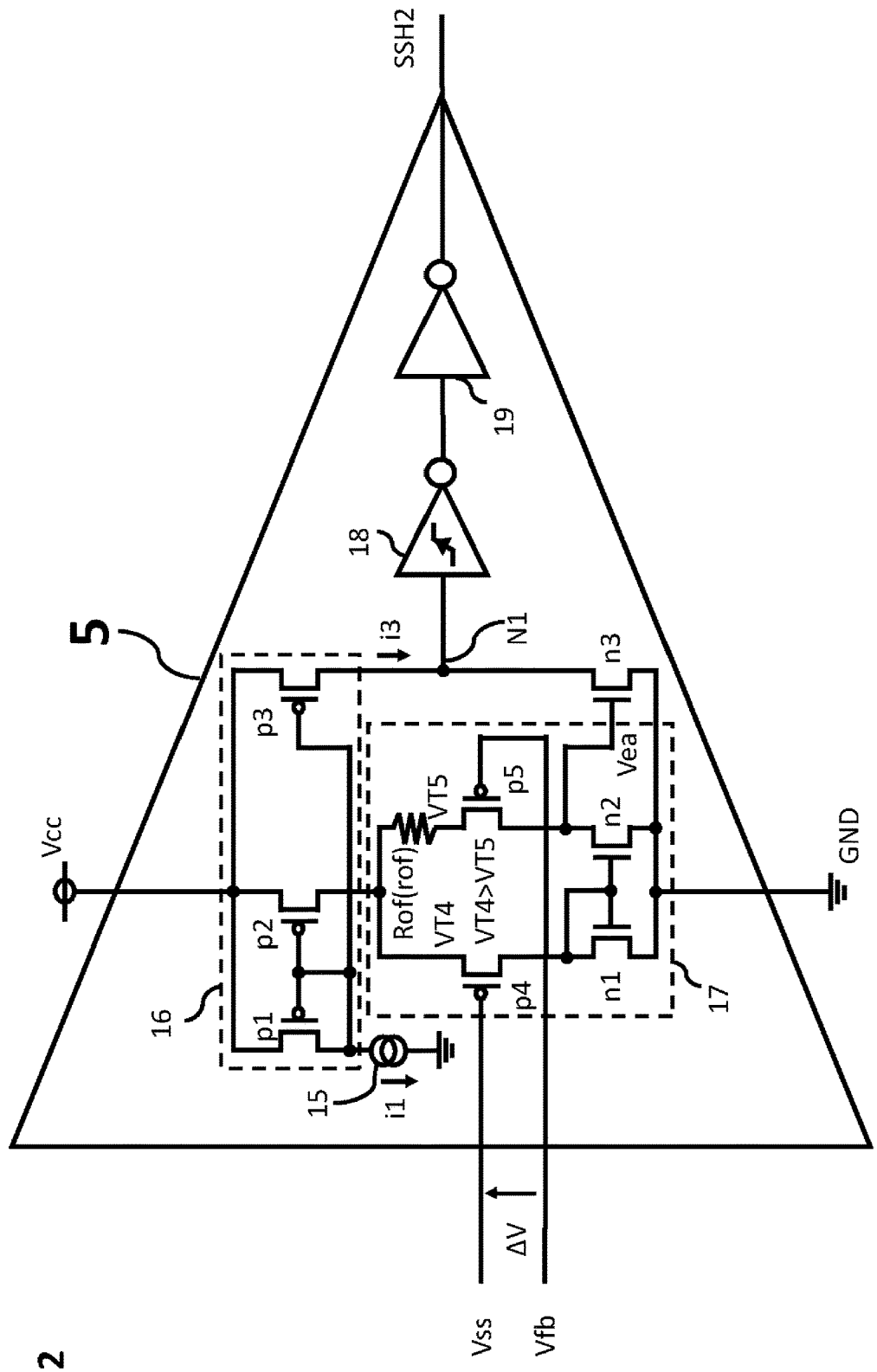
FIG. 12 is a specific circuit diagram of an offset comparator 5 illustrated in FIGS. 1, 4, and 7.

FIG. 12 illustrates an example of a detailed circuit structure of the offset comparator 5 illustrated in FIGS. 1, 4, and 7. The offset comparator 5 is constituted of a constant current source 15, a current mirror circuit 16, a differential amplifier 17, a Schmitt trigger inverter 18, an inverter 19, and an nMOS transistor n3.

The constant current source 15 generates constant current i1 for operating the current mirror circuit 16. The sources of the pMOS transistors p1 to p3 constituting the current mirror circuit are connected to the input voltage Vcc. One terminal of the constant current source 15 is connected to the drain of the pMOS transistor p1 and the gates of the pMOS transistors p1 to p3, and the other terminal thereof is connected to the ground potential GND. The drain of the pMOS transistor p2 is connected to the source of the pMOS transistor p4 and one terminal of an offset resistor Rof. The other terminal of the offset resistor Rof is connected to the drain of the pMOS transistor p5. The gate of the pMOS transistor p4 is applied with the soft-start voltage Vss, and the gate of the pMOS transistor p5 is applied with the feedback voltage Vfb.

The differential amplifier 17 disposed at an input stage of the offset comparator 5 includes the pMOS transistor p4 and the pMOS transistor p5 as differential pair transistors. The offset voltage ΔV is given between the gate of the pMOS transistor p4 and the gate of the pMOS transistor p5. The drain of the pMOS transistor p4 is connected to the drain of the nMOS transistor n1, the gate of the nMOS transistor n1, and the gate of the nMOS transistor n2. The drain of the pMOS transistor p5 is connected to the drain of the nMOS transistor n2 and the gate of the nMOS transistor n3. The sources of the nMOS transistors n1 to n3 are connected to the ground potential GND. The drain of the pMOS transistor p3 (i.e. an output terminal of fold-back current i3) and the drain of the nMOS transistor n3 are connected to each other, and the connection node between them is connected to an input of the Schmitt trigger inverter 18. An output of the Schmitt trigger inverter 18 is output via the inverter 19.

The differential amplifier 17 is constituted of pMOS transistors p4 and p5 as the differential pair transistors, the offset resistor Rof, and the nMOS transistors n1 and n2. The differential amplifier 17 amplifies a difference voltage between the soft-start voltage Vss applied to the inverting input terminal (−) and the feedback voltage Vfb applied to the noninverting input terminal (+), and outputs an amplified voltage Vea. The amplified voltage Vea is adjusted by the offset resistor Rof, and the nMOS transistor n3 operates as a switch that repeats turning on and off according to the amplified voltage Vea.

In FIG. 12, if the pMOS transistors p4 and p5 have the same size, the transistors have the same source-gate threshold voltage. When the threshold voltages of the pMOS transistors p4 and p5 are represented by VT4 and VT5, respectively, VT4=VT5 holds. Under this condition, the circuit operation of the differential amplifier 17 is balanced. In other words, when the circuit operation is balanced, if the offset resistor Rof is not disposed, and if the gate voltages of the transistors are equal to each other, the same current flows in the transistors. However, using the offset resistor Rof, it is possible to bias the currents flowing in the two pMOS transistors p4 and p5. The offset voltage ΔV is determined by the product of the constant current i1 and a resistance value rof of the offset resistor Rof, and hence the offset voltage ΔV is expressed as ΔV=i1×rof. The offset resistor Rof may be inserted in the drain side instead of the source side of the pMOS transistor p4. In addition, in order that the soft-start voltage Vss becomes dominant, it must be higher than the potential that is the feedback voltage Vfb plus the offset voltage ΔV. When the soft-start voltage Vss, the feedback voltage vfb, and the soft-start voltage ΔV satisfy the relationship of Vss>Vfb+ΔV, the pMOS transistor p4 whose gate is applied with the soft-start voltage Vss is turned off, and the pMOS transistor p5 whose gate is applied with the feedback voltage Vfb is turned on. When the pMOS transistor p5 is turned on, the nMOS transistor n3 is turned on, a potential at a node N1 becomes low level L, and the offset detection signal SSH2 becomes low level L.

On the other hand, when Vss<Vfb+ΔV is satisfied, the pMOS transistor p4 whose gate is applied with the soft-start voltage Vss is turned on, and the pMOS transistor p5 whose gate is applied with the feedback voltage Vfb is turned off. When the pMOS transistor p5 is turned off, the nMOS transistor n3 is turned off, the potential at the node N1 becomes high level H, and the offset detection signal SSH2 becomes high level H.

FIGS. 1, 4, and 7 illustrate that the offset voltage ΔV is set externally of the offset comparator 5, but it may be set internally of the offset comparator 5 as illustrated in this diagram.

Note that the potential (VN1) at the node N1 has a fluctuation called chattering due to switching operation of the nMOS transistor n3. The Schmitt trigger inverter 18 is prepared for excluding the effect of this fluctuation. In addition, the inverter 19 is prepared for polarity inversion of the signal or waveform shaping thereof. In any case, the Schmitt trigger inverter 18 and the inverter 19 are design matters and are not always necessary.

Figure 13:
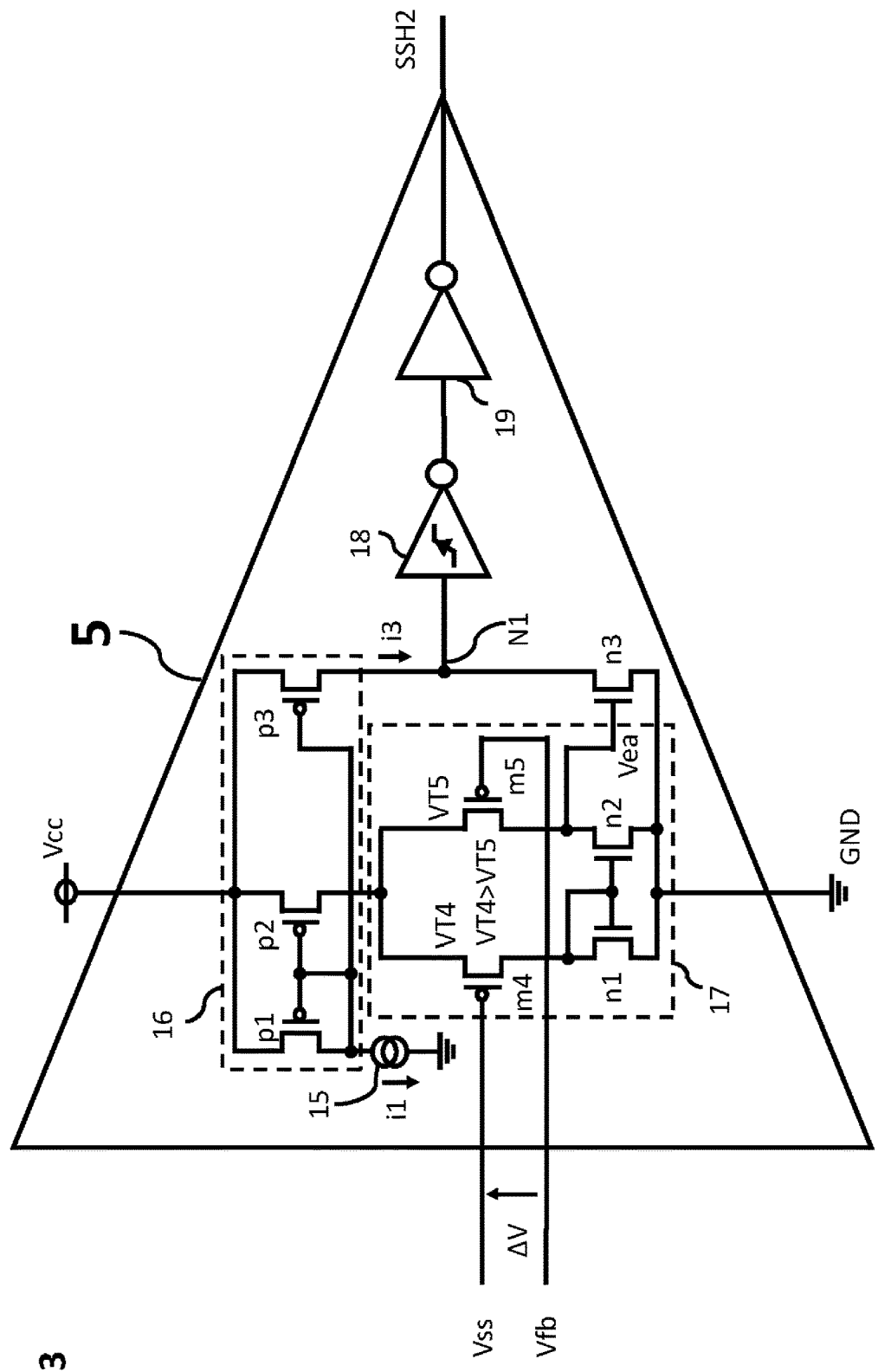
FIG. 13 is a specific circuit diagram of another offset comparator 5 different from that of FIG. 12.

FIG. 13 illustrates another specific circuit structure different from the offset comparator 5 illustrated in FIG. 12. The offset comparator 5 illustrated in FIG. 13 is different from that illustrated in FIG. 12 in that the offset resistor Rof is not adopted, the pMOS transistors p4 and p5 are replaced with pMOS transistors m4 and m5, and VT4>VT5 is satisfied where VT4 and VT5 are threshold voltages of the pMOS transistors m4 and m5, respectively. Other circuit portions are the same. A magnitude relationship between the threshold voltages of the pMOS transistors m4 and m5 as the differential pair transistors is appropriately set according to a circuit structure of the offset comparator 5.

In order that the threshold voltages of the pMOS transistors m4 and m5 are different from each other in the offset comparator 5 of FIG. 13, the threshold voltages can be easily set by adjusting gate widths or gate lengths of the pMOS transistors m4 and m5, for example. Note that in order that the threshold voltages are different from each other, it is also possible to connect a plurality of MOS transistors of the same size in parallel and change the number of the parallel-connected MOS transistors, instead of adjusting gate widths or gate lengths.

FIGS. 12 and 13 illustrate the specific circuit structures for biasing a circuit operation point of the differential amplifier 17 as a part of the offset comparator 5 instead of balancing the same. However, the offset comparator 5 is not limited to the circuit structures of FIGS. 12 and 13. For example, the differential amplifier 17 may be constituted of nMOS transistors instead of the pMOS transistors p4 and p5 (or m4 and m5).

If the differential amplifier is constituted of nMOS transistors, the offset resistor may be disposed on the side of the MOS transistor applied with the soft-start voltage Vss instead of the MOS transistor applied with the feedback voltage Vfb. In addition, the offset resistor Rof is disposed to only the source of the pMOS transistor p5 whose gate is applied with the feedback voltage Vfb in FIG. 12, but it is possible to dispose another offset resistor having a resistance value different from that of the offset resistor Rof on the source side of the pMOS transistor p4, including a case where a substantial resistance value is 0Ω. In addition, the differential amplifier 17 may be constituted of PNP or NPN bipolar transistors instead of the nMOS or pMOS transistors.

When the differential amplifier 17 is constituted of a pair of bipolar transistors, the offset resistor, regardless of a PNP type or a NPN type, is connected to at least an emitter side. In addition, without using such an offset resistor, it is possible to make base-emitter forward voltages of the bipolar transistors be different from each other so that the offset voltage is secured.

In addition, the gate of the nMOS transistor n3 connected to the node N1 as a substantial output of the offset comparator 5 may be connected to the drain side of the pMOS transistor p4 (or m4), instead of the drains of the pMOS transistor p5 (or m5) and the nMOS transistor n2. As the circuit structure of the offset comparator 5 according to the present invention, many circuit structures would be relatively easily conceived by a person skilled in the art. In any case, in the offset comparator 5 according to the present invention, the offset voltage ΔV is given to one of the soft-start voltage Vss and the feedback voltage Vfb, and when the soft-start voltage Vss becomes higher than the feedback voltage Vfb plus the offset voltage ΔV, the circuit operation of the offset comparator 5 is inverted, it is determined that the short circuit to ground has occurred when the inversion is performed, and the pMOS transistor p2 constituting the switching unit is turned off via the driving circuit 10 in post-stage, so that a malfunction that overcurrent continues to flow can be prevented.

Although the embodiments of the present invention are described above concerning the step-down type switching power supply, the present invention can also be applied to a step-up type witching power supply and a step-up/down type switching power supply.

(Summary)

The various embodiments described above are summarized below.

A switching power supply according to one aspect of the present invention includes a switching unit arranged to turn on and off an output transistor and a synchronous rectification semiconductor element to drive an inductor so that an output voltage is generated from an input voltage, an error amplifier arranged to generate an error voltage corresponding to a difference between a predetermined first reference voltage and the output voltage or a feedback voltage corresponding to the output voltage, a soft-start circuit arranged to generate a soft-start voltage, a pulse width modulation (PWM) comparator arranged to compare the error voltage with the soft-start voltage so as to generate a pulse width modulation signal, a driving circuit arranged to receive an input of the pulse width modulation signal so as to generate a drive signal for the switching unit, and an offset comparator arranged to compare the soft-start voltage with the feedback voltage, with a predetermined offset voltage. When Vss≥Vfb+ΔV holds, where Vss represents the soft-start voltage, Vfb represents the feedback voltage, and ΔV represents the offset voltage, then the output transistor is turned off via the driving circuit based on an offset detection signal output from the offset comparator.

Further, a switching power supply according to another aspect of the present invention further includes an short-circuit-to-ground detection circuit arranged to compare the feedback voltage with a second reference voltage so as to output a first short-circuit-to-ground output signal, and an AND circuit arranged to perform an AND operation between the offset detection signal and the first short-circuit-to-ground output signal, in which the output transistor is turned off via the driving circuit by a short protection control signal output from the AND circuit.

Further, a switching power supply according to another aspect of the present invention includes a short-circuit-to-ground detection circuit arranged to compare the feedback voltage with a second reference voltage so as to output a first short-circuit-to-ground output signal, a short-circuit-to-ground detection unit arranged to detect the feedback voltage so as to output a short-circuit-to-ground detection signal after the soft-start voltage reaches the first reference voltage, a protection signal selection circuit arranged to select one of the short-circuit-to-ground detection signal and the offset detection signal so as to output a second short-circuit-to-ground output signal, and an AND circuit having a first input terminal and a second input terminal applied with the first short-circuit-to-ground output signal and the second short-circuit-to-ground output signal, respectively. The output transistor is turned off via the driving circuit by a short protection control signal output from the AND circuit.

Further, in a switching power supply according to another aspect of the present invention, the offset voltage is set to be lower than the first reference voltage.

Further, in a switching power supply according to another aspect of the present invention, ΔV>Vmax−Vref1 holds, where ΔV represents the offset voltage, Vmax represents a maximum value of the soft-start voltage, and Vref1 represents the first reference voltage.

Further, in a switching power supply according to another aspect of the present invention, an input stage of the offset comparator includes a differential amplifier, an offset resistor is connected to one of differential pair transistors of the differential amplifier, and the offset voltage is set by the offset resistor.

Further, in a switching power supply according to another aspect of the present invention, each of the differential pair transistors is constituted of a MOS transistor or a bipolar transistor.

Further, in a switching power supply according to another aspect of the present invention, the differential pair transistors are constituted of a first MOS transistor and a second MOS transistor, the source of the first MOS transistor is connected to a first offset resistor, and the source of the second MOS transistor is connected to a second offset resistor having a resistance value different from that of the first offset resistor.

Further, in a switching power supply according to another aspect of the present invention, the differential pair transistors are constituted of a first MOS transistor and a second MOS transistor, and a gate-source threshold voltage of the first MOS transistor is set to be different from that of the second MOS transistor.

Further, in a switching power supply according to another aspect of the present invention, the differential pair transistors are constituted of a first bipolar transistor and a second bipolar transistor, the emitter of the first bipolar transistor is connected to a first offset resistor, and the emitter of the second bipolar transistor is connected to a second offset resistor having a resistance value different from that of the first offset resistor.

Further, in a switching power supply according to another aspect of the present invention, the differential pair transistors are constituted of a first bipolar transistor and a second bipolar transistor, and base-emitter forward voltages of the first bipolar transistor and the second bipolar transistor are set to be different from each other.

Further, in a switching power supply according to another aspect of the present invention, one of the first offset resistor and the second offset resistor has a resistance value of substantially 0Ω.

Further, in a switching power supply according to another aspect of the present invention, a first input terminal and a second input terminal as noninverting input terminals and a third input terminal as an inverting input terminal are prepared on an input side of the error amplifier, the first input terminal is applied with the soft-start voltage, the second input terminal is applied with the first reference voltage, and the third input terminal is applied with the feedback voltage.

Further, in a switching power supply according to another aspect of the present invention, the second reference voltage is set to a potential lower than the first reference voltage.

Further, in a switching power supply according to another aspect of the present invention, the protection signal selection circuit includes a two-input latch circuit supplied with two signals including the short-circuit-to-ground detection signal and an enable signal for raising the soft-start voltage, and a selector arranged to select and output one of the short-circuit-to-ground detection signal and the offset detection signal according to an output of the two-input latch circuit.

Further, in a switching power supply according to another aspect of the present invention, the two-input latch circuit includes a NAND circuit or a NOR circuit.

Further, in a switching power supply according to another aspect of the present invention, short-circuit-to-ground detection is masked until the offset detection signal is generated.

Further, in a switching power supply according to another aspect of the present invention, the short-circuit-to-ground detection is masked until the second short-circuit-to-ground output signal is generated.

A method for detecting a short circuit to ground in a switching power supply according to one aspect of the present invention includes masking short-circuit-to-ground detection during a short-circuit-to-ground detection time period tx1 until the short-circuit-to-ground detection signal is generated when a short circuit to ground occurs for the first time after an enable signal is input, and masking short-circuit-to-ground detection during a short-circuit-to-ground detection time period tx2 until the offset detection signal is generated when a short circuit to ground occurs for the second time after the first short circuit to ground is cancelled in a state where input of the enable signal is continued.

Further, in a method for detecting a short circuit to ground in a switching power supply according to another aspect of the present invention, a relationship of tx2≤tx1 is satisfied between the time period tx2 and the time period tx1.

Further, a switching power supply according to another aspect of the present invention includes a short-circuit-to-ground detection circuit arranged to perform short-circuit-to-ground detection of a monitoring target terminal, in which an output of the short-circuit-to-ground detection circuit is masked during a first period when a short circuit to ground occurs for the first time, and the output of the short-circuit-to-ground detection circuit is masked during a second period shorter than the first period when a short circuit to ground occurs for the second or any succeeding time.

The switching power supply arranged to the present invention detects the feedback voltage using the soft-start voltage and the offset voltage, so as to quickly and appropriately detect a short circuit to ground state of the output terminal or the feedback terminal of the switching power supply. Thus, it is possible to prevent a malfunction that overcurrent flows in the output transistor.

INDUSTRIAL APPLICABILITY

The switching power supply according to the present invention can perform short-circuit-to-ground detection quickly and securely with a relatively simple circuit structure, and therefore has high industrial utilization value.

What is claimed is:
1. A switching power supply comprising:
a switching unit arranged to turn on and off an output transistor and a synchronous rectification semiconductor element to drive an inductor so that an output voltage is generated from an input voltage;
an error amplifier arranged to generate an error voltage corresponding to a difference between a predetermined first reference voltage and the output voltage or a feedback voltage corresponding to the output voltage;
a soft-start circuit arranged to generate a soft-start voltage;
a pulse width modulation (PWM) comparator arranged to compare the error voltage with a slope voltage so as to generate a pulse width modulation signal;
a driving circuit arranged to receive an input of the pulse width modulation signal so as to generate a drive signal for the switching unit; and
an offset comparator arranged to compare the soft-start voltage with the feedback voltage, with a predetermined offset voltage, wherein
when $Vss \geq Vfb + \Delta V$ holds, where $Vss$ represents the soft-start voltage, $Vfb$ represents the feedback voltage, and $\Delta V$ represents the offset voltage, then the output transistor is turned off via the driving circuit based on an offset detection signal output from the offset comparator, wherein
the switching power supply further comprises:
a short-circuit-to-ground detection circuit arranged to compare the feedback voltage with a second reference voltage so as to output a first short-circuit-to-ground output signal; and
an AND circuit arranged to perform an AND operation between the offset detection signal and the first short-circuit-to-ground output signal, wherein the output transistor is turned off via the driving circuit by a short protection control signal output from the AND circuit.

2. The switching power supply according to claim 1, wherein the offset voltage is set to be lower than the first reference voltage.

3. The switching power supply according to claim 2, wherein $\Delta V > V_{max} - V_{ref1}$ holds, where $\Delta V$ represents the offset voltage, Vmax represents a maximum value of the soft-start voltage, and Vref1 represents the first reference voltage.

4. The switching power supply according to claim 1, wherein an input stage of the offset comparator includes a differential amplifier, an offset resistor is connected to one of differential pair transistors of the differential amplifier, and the offset voltage is set by the offset resistor.

5. The switching power supply according to claim 4, wherein each of the differential pair transistors is constituted of a MOS transistor or a bipolar transistor.

6. The switching power supply according to claim 5, wherein the differential pair transistors are constituted of a first MOS transistor and a second MOS transistor, the source of the first MOS transistor is connected to a first offset resistor, and the source of the second MOS transistor is connected to a second offset resistor having a resistance value different from that of the first offset resistor.

7. The switching power supply according to claim 6, wherein one of the first offset resistor and the second offset resistor has a resistance value of substantially $0\Omega$.

8. The switching power supply according to claim 5, wherein the differential pair transistors are constituted of a first MOS transistor and a second MOS transistor, and a gate-source threshold voltage of the first MOS transistor is set to be different from that of the second MOS transistor.

9. The switching power supply according to claim 5, wherein the differential pair transistors are constituted of a first bipolar transistor and a second bipolar transistor, the emitter of the first bipolar transistor is connected to a first offset resistor, and the emitter of the second bipolar transistor is connected to a second offset resistor having a resistance value different from that of the first offset resistor.

10. The switching power supply according to claim 5, wherein the differential pair transistors are constituted of a first bipolar transistor and a second bipolar transistor, and base-emitter forward voltages of the first bipolar transistor and the second bipolar transistor are set to be different from each other.

11. The switching power supply according to claim 1, wherein a first input terminal and a second input terminal as noninverting input terminals and a third input terminal as an inverting input terminal are prepared on an input side of the error amplifier, the first input terminal is applied with the soft-start voltage, the second input terminal is applied with the first reference voltage, and the third input terminal is applied with the feedback voltage.

12. The switching power supply according to claim 1, wherein the second reference voltage is set to a potential lower than the first reference voltage.

13. A switching power supply comprising:
a switching unit arranged to turn on and off an output transistor and a synchronous rectification semiconductor element to drive an inductor so that an output voltage is generated from an input voltage;
an error amplifier arranged to generate an error voltage corresponding to a difference between a predetermined first reference voltage and the output voltage or a feedback voltage corresponding to the output voltage;
a soft-start circuit arranged to generate a soft-start voltage;
a pulse width modulation (PWM) comparator arranged to compare the error voltage with a slope voltage so as to generate a pulse width modulation signal;
a driving circuit arranged to receive an input of the pulse width modulation signal so as to generate a drive signal for the switching unit; and
an offset comparator arranged to compare the soft-start voltage with the feedback voltage, with a predetermined offset voltage, wherein
when $Vss \geq Vfb + \Delta V$ holds, where Vss represents the soft-start voltage, Vfb represents the feedback voltage, and $\Delta V$ represents the offset voltage, then the output transistor is turned off via the driving circuit based on an offset detection signal output from the offset comparator, wherein
the switching power supply further comprises:
a short-circuit-to-ground detection circuit arranged to compare the feedback voltage with a second reference voltage so as to output a first short-circuit-to-ground output signal;
a short-circuit-to-ground detection unit arranged to detect the feedback voltage so as to output a short-circuit-to-ground detection signal after the soft-start voltage reaches the first reference voltage;
a protection signal selection circuit arranged to select one of the short-circuit-to-ground detection signal and the offset detection signal so as to output a second short-circuit-to-ground output signal; and
an AND circuit having a first input terminal and a second input terminal applied with the first short-circuit-to-ground output signal and the second short-circuit-to-ground output signal, respectively, wherein
the output transistor is turned off via the driving circuit by a short protection control signal output from the AND circuit.

14. The switching power supply according to claim 13, wherein the protection signal selection circuit includes a two-input latch circuit supplied with two signals including the short-circuit-to-ground detection signal and an enable signal for raising the soft-start voltage, and a selector arranged to select and output one of the short-circuit-to-ground detection signal and the offset detection signal according to an output of the two-input latch circuit.

15. The switching power supply according to claim 14, wherein the two-input latch circuit is constituted of a NAND circuit or a NOR circuit.

16. The switching power supply according to claim 13, wherein short-circuit-to-ground detection is masked until the second short-circuit-to-ground output signal is generated.

17. A method for detecting a short circuit to ground using the switching power supply according to claim 13, the method comprising:
masking short-circuit-to-ground detection during a short-circuit-to-ground detection time period tx1 until the short-circuit-to-ground detection signal is generated when a short circuit to ground occurs for the first time after an enable signal is input; and
masking short-circuit-to-ground detection during a short-circuit-to-ground detection time period tx2 until the offset detection signal is generated when a short circuit to ground occurs for the second time after the first short circuit to ground is cancelled in a state where input of the enable signal is continued.

18. The method for detecting a short circuit to ground according to claim 17, wherein a relationship of tx2≤tx1 is satisfied between the short-circuit-to-ground detection time period tx2 and the short-circuit-to-ground detection time period tx1.

19. A switching power supply comprising:
- a switching unit arranged to turn on and off an output transistor and a synchronous rectification semiconductor element to drive an inductor so that an output voltage is generated from an input voltage;
- an error amplifier arranged to generate an error voltage corresponding to a difference between a predetermined first reference voltage and the output voltage or a feedback voltage corresponding to the output voltage;
- a soft-start circuit arranged to generate a soft-start voltage;
- a pulse width modulation (PWM) comparator arranged to compare the error voltage with a slope voltage so as to generate a pulse width modulation signal;
- a driving circuit arranged to receive an input of the pulse width modulation signal so as to generate a drive signal for the switching unit; and
- an offset comparator arranged to compare the soft-start voltage with the feedback voltage, with a predetermined offset voltage, wherein
- when Vss≥Vfb+ΔV holds, where Vss represents the soft-start voltage, Vfb represents the feedback voltage, and ΔV represents the offset voltage, then the output transistor is turned off via the driving circuit based on an offset detection signal output from the offset comparator, wherein short-circuit-to-ground detection is masked until the offset detection signal is generated.

* * * * *